(12) United States Patent
Uno et al.

(10) Patent No.: US 8,653,668 B2
(45) Date of Patent: Feb. 18, 2014

(54) COPPER BONDING WIRE FOR SEMICONDUCTOR DEVICE AND BONDING STRUCTURE THEREOF

(75) Inventors: Tomohiro Uno, Tokyo (JP); Takashi Yamada, Iruma (JP); Atsuo Ikeda, Iruma (JP)

(73) Assignees: Nippon Steel & Sumikin Materials Co., Ltd., Tokyo (JP); Nippon Micrometal Corporation, Saitama (JP)

( * ) Notice: Subject to any disclaimer, the term of this patent is extended or adjusted under 35 U.S.C. 154(b) by 0 days.

(21) Appl. No.: 13/577,199

(22) PCT Filed: Feb. 3, 2011

(86) PCT No.: PCT/JP2011/052270
§ 371 (c)(1),
(2), (4) Date: Aug. 3, 2012

(87) PCT Pub. No.: WO2011/096487
PCT Pub. Date: Aug. 11, 2011

(65) Prior Publication Data
US 2012/0299182 A1  Nov. 29, 2012

(30) Foreign Application Priority Data
Feb. 3, 2010  (JP) .................................. 2010-021971

(51) Int. Cl.
*H01L 23/49* (2006.01)

(52) U.S. Cl.
USPC ............ 257/771; 257/E23.025; 257/E21.509; 257/762; 257/737; 257/738; 257/734; 257/778; 257/783; 257/780; 257/784; 257/786

(58) Field of Classification Search
USPC .......... 257/771, 780, E23.025, E21.509, 762, 257/737, 738, 734, 778, 783, 784, 786
See application file for complete search history.

(56) References Cited

U.S. PATENT DOCUMENTS

2003/0211660 A1* 11/2003 Lim et al. ...................... 438/127
2005/0079347 A1* 4/2005 Uno et al. ..................... 428/364
(Continued)

FOREIGN PATENT DOCUMENTS

JP  61-020693 A  1/1986
JP  61-251062 A  11/1986
(Continued)

OTHER PUBLICATIONS

"Effects of Cu-Al intermetallicompound (IMC) on copper wire and aluminum pad bondability": H.Kim et al., IEEE Transactions on Advanced Packaging, 29(2003), pp. 367-374.
(Continued)

*Primary Examiner* — Alexander O Williams
(74) *Attorney, Agent, or Firm* — McDermott Will & Emery LLP

(57) ABSTRACT

A bonding structure and a copper bonding wire for semiconductor device include a ball-bonded portion formed by bonding to the aluminum electrode a ball formed on a front end of the copper bonding wire. After being heated at any temperature between 130° C. and 200° C., the ball-bonded portion exhibits a relative compound ratio R1 of 40-100%, the relative compound ratio R1 being a ratio of a thickness of a Cu—Al intermetallic compound to thicknesses of intermetallic compounds that are composed of Cu and Al and formed on a cross-sectional surface of the ball-bonded portion.

14 Claims, 2 Drawing Sheets

IC: Intermetallic Compound
XA: Intermetallic Compound of a CuAl phase

(56) References Cited

U.S. PATENT DOCUMENTS

| | | |
|---|---|---|
| 2010/0213619 A1 | 8/2010 | Uno et al. |
| 2012/0001336 A1* | 1/2012 | Zeng et al. .................... 257/769 |
| 2012/0153444 A1* | 6/2012 | Haga et al. .................... 257/666 |
| 2012/0223432 A1* | 9/2012 | Delucca et al. ............... 257/771 |
| 2012/0273954 A1* | 11/2012 | Higgins, III .................. 257/762 |

FOREIGN PATENT DOCUMENTS

| | | |
|---|---|---|
| JP | 02-187042 A | 7/1990 |
| JP | 08-078459 A | 3/1996 |
| JP | 2004-064033 A | 2/2004 |
| JP | 2006-190763 A | 7/2006 |
| JP | 2006-216929 A | 8/2006 |
| JP | 2009-177104 A | 8/2009 |
| WO | WO-2008/087922 A1 | 7/2008 |

OTHER PUBLICATIONS

M. Drozdov et al., "Detailed investigation of ultrasonic Al-Cu wirebond: Mircrostructural evolution during annealing", J Material Science, 43(2008), pp. 6038-6048.

International Search Report mailed Mar. 1, 2011 issued in corresponding International Application No. PCT/JP2011/052270.

* cited by examiner

IC: Intermetallic Compound
XA: Intermetallic Compound
    of a CuAl phase

XB: Concentrated Layer

COPPER BONDING WIRE FOR SEMICONDUCTOR DEVICE AND BONDING STRUCTURE THEREOF

RELATED APPLICATIONS

This application is the U.S. National Phase under 35 U.S.C. §371 of International Application No. PCT/JP2011/052270, filed on Feb. 3, 2011, which in turn claims the benefit of Japanese Application No. 2010-021971, filed on Feb. 3, 2010, the disclosures of which Applications are incorporated by reference herein.

TECHNICAL FIELD

The present invention relates to a copper bonding wire for semiconductor and a bonding structure thereof.

BACKGROUND ART

Nowadays, as a bonding wire (a wire used for connection in a wire bonding method) for connecting an electrode on a semiconductor device and an external terminal, there is mainly used a thin wire (bonding wire) having a wire diameter of about 13-50 μm. Wire bonding is generally performed through a thermocompression bonding method with the aid of ultrasonic waves. Here, there are used, for example, a general bonding device and a capillary jig allowing a bonding wire to be passed thereinside when performing bonding. Particularly, a wire front end is heated and melted through an arc heat input so as to allow a ball to be formed through a surface tension, followed by press-bonding this ball to an electrode of a semiconductor device heated in a range of 150-300° C., and then directly bonding the bonding wire to an external lead side through ultrasonic bonding.

In recent years, rapid diversifications have been observed in, for example, a semiconductor mounting structure, material and connection technology. For example, as for a mounting structure other than the existing QFP (Quad Flat Packaging) using a lead frame, there have been put to practical use new mounting methods including, for example: BGA (Ball Grid Array) using a substrate, a polyimide tape and the like; and CSP (Chip Scale Packaging). For this reason, there has been demanded a bonding wire with further improved properties including a loop property, a bondability, a mass productivity and the like.

A highly-pure 4N type gold (purity>99.99 mass %) has been mainly used as a material of a bonding wire. However, since gold is expensive, there has been desired a bonding wire made of an other kind of metal that is inexpensive in terms of material cost.

Patent document 1 discloses a bonding wire made of copper (referred to as "copper bonding wire" hereunder) that has been developed for the purpose of achieving, for example, a superior electric conductivity, an improved ball bondability and an improved wedge bondability at an inexpensive material cost. However, a copper bonding wire imposes problems including: a decrease in a bonding strength due to an oxidation on a wire surface; and a tendency of causing corrosion or the like to occur on the wire surface when encapsulated by resin. Those are also the reasons why the copper bonding wire has not yet been fully put to practical use in LSIs.

Materials to be bonded by a bonding wire mainly include, for example: a pure Al or an Al alloy as a wiring or an electrode on a silicon substrate. Here, the Al alloy is often an alloy of Al-1% Si, Al-0.5% Cu, Al-1% Si-0.5% Cu or the like. Even a Cu wiring for use in a micro wiring often includes an Al alloy or the like used on a surface thereof. Particularly, an Ag plating, a Pd plating or the like is performed on a lead frame, the Cu wiring is formed on a resin substrate, a tape or the like, and films of: a noble metal element such as gold or the like; and an alloy thereof are further formed on the Cu wiring. Here, it is required that a bondability and a bonding reliability of a bonding wire be improved to deal with the aforementioned various materials to be bonded.

As for the copper bonding wire, wire bonding is so performed that, for the purpose of controlling oxidation, a nitrogen gas or a nitrogen gas containing hydrogen by about 5% is sprayed on the wire front end when forming the ball thereon by melting the corresponding wire front end.

As is the case in the conventional gold bonding wire, the copper bonding wire is also required to satisfy reliability tests intended for semiconductors. A wire-bonded semiconductor, after being encapsulated by resin, is subjected to a reliability test for evaluating a practical use thereof in an accelerated manner. Typically, there are performed, for example: an HTS test (High Temperature Storage) featuring heating at a high temperature; a PCT (Pressure Cooker Test) which is a heating test performed in a high-humidity/temperature environment; and a HAST (Highly Accelerated Temperature and Humidity Stress Test). The PCT is also referred to as a saturated pressurized water vapor test whose general condition includes heating at a temperature of 121° C. and a relative humidity (RH) of 100% with no electrical bias being applied. Meanwhile, the HAST is also referred to as an unsaturated pressurized water vapor test whose general condition includes heating at a temperature of 130° C. and a relative humidity (RH) of 85% with an electrical bias being applied.

As compared to the conventional gold bonding wire, a few reports have been made on a bonding reliability of a bonded portion formed of a copper bonding wire and an aluminum or lead electrode. Patent document 3 and Non-patent document 1, for example, report on a bonding reliability of a Cu/Al bonded portion. It is known that intermetallic compounds in the Cu/Al bonded portion grow significantly more slowly than those in an Au/Al bonded portion. Therefore, it is assumed that the copper bonding wire, when heated at a high temperature, exhibits a more favorable bonding reliability than that of the gold bonding wire, due to slow growth rates of the intermetallic compounds in the Cu/Al bonded portion. Since there are no past records indicating that the copper bonding wire has ever been used in LSIs, no full study has ever been carried out on, for example, a reliability of the copper bonding wire being used, thus leaving a standard for a reliability evaluation, a life or the like unclear.

PRIOR ART DOCUMENTS

Patent Documents

Patent document 1: Japanese Unexamined Patent Application Publication No. Sho 61-251062
Patent document 2: Japanese Unexamined Patent Application Publication No. Sho 61-20693
Patent document 3: International publication WO2008-87922

Non-Patent Document

Non-patent document 1: "Effects of Cu—Al intermetalli-compound (IMC) on copper wire and aluminum pad bondability": H. Kim, J. Lee, K Parik, K Koh, J. Won, IEEE Transactions on Advanced Packaging, 29 (2003), pp. 367-374.

Non-patent document 2: M. Drozdov, G Gur, Z. Atzmon, W. Kaplan, "Detailed investigation of ultrasonic Al—Cu wire-bond: Microstructural evolution during annealing", J Material Science, 43 (2008), pp. 6038-6048.

DISCLOSURE OF THE INVENTION

Problems to be Solved by the Invention

While the copper bonding wire has been used only in discrete semiconductors (discrete IC) such as transistors or the like, it has not yet been put to practical use in LSIs, thus resulting in insufficient studies on the reliability of the copper bonding wire being used. Through studies based on a strict reliability standard intended for LSI, there will be concerns on a long-term reliability of the Cu/Al bonded portion.

As for a vehicle-mounted LSI used in a vehicle, there is required a reliability under a more severe high-temperature-use environment. While heating at a temperature of 125° C. is common in a reliability test intended for a general-purpose LSI, the vehicle-mounted LSI requires a reliability at a higher temperature of 150-175° C. Further, in terms of future demand, there is also expected a reliability at a high temperature of 180-250° C.

As for the reliability of the bonded portion that is evaluated in the HTS test of the copper bonding wire, problems include, for example, a decrease in a strength of the bonded portion formed of the copper bonding wire and the aluminum electrode. While heating at a low temperature of about 125° C. causes no problem, a long-term heating at a temperature of 150-175° C. problematically results in failures including, for example, the decrease in the strength of the Cu/Al bonded portion and an increase in electrical resistance. Therefore, the copper bonding wire can be put to practical use in the vehicle-mounted LSI, if the bonding reliability thereof in the temperature range of 150-175° C. is improved.

Further, even in the case of the vehicle-mounted LSI, when used in a severe environment such as a periphery of an engine, there is required a reliability under a severe environment combining a high temperature and a high humidity. The PCT and the HAST performed on the bonded portion of the copper bonding wire, indicate that the decrease in the strength of the Cu/Al bonded portion occurs in a shorter time than that of an Au bonding wire, which has become a concern recently.

It is an object of the present invention to provide: a copper bonding wire for semiconductor that is capable of solving the aforementioned problems regarding bonding reliability; and a bonding structure thereof, the copper bonding wire being: mainly composed of Cu which is cheaper than gold composing a gold bonding wire; capable of improving a bonding reliability in a high-temperature environment or a high-humidity/temperature environment, thus being applicable in a vehicle-mounted LSI.

Means to Solve the Problems

The invention according to a first aspect of the present invention is a bonding structure of a copper bonding wire connected to an electrode of a semiconductor device through a ball-bonded portion obtained by bonding to an aluminum electrode a ball portion formed on a front end of the copper bonding wire, in which the ball-bonded portion exhibits, on a cross-sectional surface thereof, a relative compound ratio R1 of 50-100% after being heated at any temperature in a range of 130-200° C., the relative compound ratio R1 being a ratio of a thickness of an intermetallic compound of a CuAl phase to a total thickness of intermetallic compounds that are composed of Cu and Al and formed on a cross-sectional surface of the ball-bonded portion.

According to a second aspect of the present invention, the ball-bonded portion exhibits, on the cross-sectional surface thereof, a relative compound ratio R2 of 50-100% after being heated at any temperature in the range of 130-200° C. and at any relative humidity in a range of 85-100%, the relative compound ratio R2 being a ratio of the thickness of the intermetallic compound of the CuAl phase to the total thickness of the intermetallic compounds that are composed of Cu and Al and formed on the cross-sectional surface of the ball-bonded portion.

According to a third aspect of the present invention, a ratio of a total thickness of intermetallic compounds of $Cu_9Al_4$ and $CuAl_2$ phases to the total thickness of the intermetallic compounds that are composed of Cu and Al and formed in the ball-bonded portion, is not lower than 0% but lower than 40%.

According to a fourth aspect of the present invention, the ball-bonded portion includes a concentrated layer of at least one of Pd, Au and Ag serving as electrically-conductive metals.

According to a fifth aspect of the present invention, the ball-bonded portion further includes an intermetallic compound composed of: Cu; Al; and at least one of Pd, Au and Ag serving as the electrically-conductive metals.

According to a sixth aspect of the present invention, the ball-bonded portion further includes a Cu alloy layer containing at least one of Pd, Au and Ag serving as electrically-conductive metals in a total concentration of up to 0.5-30 mol %.

The invention according to a seventh aspect of the present invention is a copper bonding wire for semiconductor connected to an electrode of a semiconductor device through a ball-bonded portion obtained by bonding to an aluminum electrode a ball portion formed on a front end of the copper bonding wire, in which the ball-bonded portion exhibits, on a cross-sectional surface thereof, a relative compound ratio R1 of 50-100% after being heated at any temperature in a range of 130-200° C., the relative compound ratio R1 being a ratio of a thickness of an intermetallic compound of a CuAl phase to a total thickness of intermetallic compounds that are composed of Cu and Al and formed on a cross-sectional surface of the ball-bonded portion.

The invention according to an eighth aspect of the present invention includes: a core member mainly composed of copper; and an outer layer mainly composed of at least one of Pd, Au and Ag serving as electrically-conductive metals.

According to a ninth aspect of the present invention, the outer layer includes: a single outer layer composed of one of Pd, Au and Ag serving as the electrically-conductive metals; and an alloy outer layer mainly composed of at least two of Pd, Au and Ag serving as the electrically-conductive metals.

According to a tenth aspect of the present invention, the outer layer is formed to a thickness of 0.01-0.4 µm.

The invention according to an eleventh aspect of the present invention contains at least one of Pd, Au and Ag serving as the electrically-conductive metals in a range of 0.1-3 mol %.

The invention according to a twelfth aspect of the present invention contains at least one of P, Si, B and Ge, in a range of 0.0001-0.03 mol %.

Effects of the Present Invention

The copper bonding wire for semiconductor and the bonding structure thereof of the present invention, can be achieved at an inexpensive material cost, exhibit a superior long-term reliability in a bonded portion formed with an Al electrode, and be used in a vehicle-mounted LSI.

BRIEF DESCRIPTION OF THE DRAWINGS

The drawing figures depict one or more implementations in accord with the present teachings, by way of example only, not by way of limitation. In the figures, like reference numerals refer to the same or similar elements.

MODE FOR CARRYING OUT THE INVENTION

Figure 1:
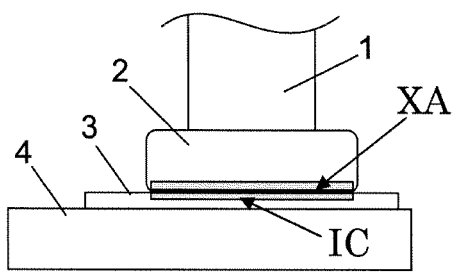
FIG. 1 is a cross sectional view showing one of exemplary bonding structures.

After earnestly studying about a copper bonding wire exhibiting a superior bonding reliability in a high-temperature or high-humidity/temperature environment, it was found that the following copper bonding wire was superior in the aforementioned bonding reliability. That is, as shown in FIG. 1, the copper bonding wire 1 connected to an electrode of a semiconductor device 4 first allows a ball-bonded portion to be formed as a result of bonding to an aluminum electrode 3 a ball portion 2 formed on a front end of the corresponding copper bonding wire 1. The ball-bonded portion (between the ball portion 2 and aluminum electrode 3) thus formed is then heated at a given temperature such that an intermetallic compound of a CuAl phase XA having a given thickness may be formed in an intermetallic compound IC. The ball-bonded portion has the intermetallic compound of CuAl phase XA.

Here, a relative compound ratio R1 is defined as a ratio of the thickness of the intermetallic compound of the CuAl phase to a thickness of intermetallic compounds IC (see FIG. 1) observed on the cross-sectional surface of the ball-bonded portion and composed of Cu and Al, such intermetallic compounds being formed by heating the ball-bonded portion at any temperature between 130° C. and 200° C., and such ball-bonded portion being formed by bonding to the aluminum electrode the ball portion formed on the front end of the copper bonding wire. Particularly, a bonding structure exhibiting an R1 of 50-100% is desired. A copper bonding wire having such bonding structure improves a bonding reliability thereof in the high-temperature or high-humidity/temperature environment. An intermetallic compound in this case is an intermediate phase with not less than two kinds of elements mixed with one another at a given composition ratio. Here, a crystal structure, lattice constants and the like of such intermetallic compound are different from those of the combined elements. By evaluating the relative compound ratio R1 of the CuAl phase in the heated ball-bonded portion, there can be accurately reflected: a bonding reliability in terms of practical use of a semiconductor; and a bonding reliability in a state in which the intermetallic compounds have grown through a reliability test.

Failures in a reliability test of a semiconductor with a copper bonding wire connected therein, include a strength decrease and an electric resistance increase that are observed in the ball-bonded portion (referred to as "Cu/Al bonded portion" hereunder) formed of the copper bonding wire and the aluminum electrode. The inventors of the present invention revealed that failure causes in a Cu/Al bonded interface (bonded interface between the copper bonding wire and the aluminum electrode) could be divided into two categories including void formation and corrosion reaction.

Voids are tiny air pockets (voids). A large number of voids occur in the vicinity of a boundary between the ball portion and the intermetallic compounds composed of Cu and Al. Void formation causes a bonding strength to decrease significantly, and may even lead to peeling in certain noticeable cases. Although the mechanism of void formation has not been fully disclosed, it is assumed that voids are an assembly of atomic vacancies (vacancies) contributing to atomic diffusion and that void formation is closely associated with a growth of an intermetallic compound.

After examining a relationship between intermetallic compound growth and void formation/growth, it was found that not all five phases of intermetallic compounds composed of Cu and Al that were shown in a phase diagram contributed to inducing void formation. Further, it was found that void formation could be effectively controlled by facilitating a growth of the CuAl phase (with a composition ratio of Cu:Al=1:1) which was a particular intermetallic compound. Since the CuAl phase is an intermetallic compound phase with a slow growth rate, it is less likely that the CuAl phase will preferentially grow in a bonded interface of a normal copper bonding wire. The aforementioned function brought about by the CuAl phase can be effectively achieved in a copper bonding wire treated under the aforementioned conditions and exhibiting a relative compound ratio R1 of the CuAl phase of not lower than 50%.

It is known that a $Cu_9Al_4$ phase and a $CuAl_2$ phase are the main phases of the intermetallic compounds composed of Cu and Al, which grow in the ball-bonded portion formed of the copper bonding wire and the aluminum electrode. Nonpatent document 2 reports growths of similar intermetallic compounds, which were observed through a latest TEM analysis technique. So far, a causal correlation between the $Cu_9Al_4$ and $CuAl_2$ phases and the bonding reliability, has not yet been disclosed. The inventors of the present invention conducted a detailed examination regarding the causal correlation, and confirmed that the aforementioned two intermetallic compounds contributed to inducing void formation, particularly to coarsening the voids. While a detailed mechanism thereof sill remains unclear, it is assumed, for example, that the growths of the corresponding intermetallic compounds lead to a stoichiometric deviation allowing highly-concentrated atomic vacancies to occur, and that the voids are coarsened as the atomic vacancies assemble due to a high Kirkendall effect, such high Kirkendall effect being brought about by a difference between interdiffusion speeds of Cu and Al.

It is assumed that the CuAl phase is capable of controlling void formation by controlling, for example, the aforementioned occurrences of the atomic vacancies and the aforementioned Kirkendall effect. The CuAl phase is an intermetallic compound phase with a slow growth rate. It has been difficult to preferentially allow the CuAl phase to grow in the bonded interface of the conventional copper bonding wire. Instead, other phases of the intermetallic compounds composed of Cu and Al grow when heated at a high temperature, thus resulting in void formation. The bonding reliability under a high-temperature heating can be improved by facilitating the growth of the CuAl phase. That is, the bonding reliability under the high-temperature heating can be improved, if the ball-bonded portion exhibits the relative compound ratio R1 of the CuAl phase of not lower than 50% as mentioned above after being heated at any temperature between 130° C. and 200° C., such ball-bonded portion being formed by bonding to the aluminum electrode the ball portion formed on the front end of the copper bonding wire.

A growth ratio of the CuAl phase is critical in improving the bonding reliability. Particularly, when the relative compound ratio R1 is not lower than 50%, void formation is controlled, thereby achieving a favorable bonding reliability, such relative compound ratio R1 being the ratio of the thickness of the CuAl phase on the cross-sectional surface of the ball-bonded portion. That is, according to the copper bonding wire of the present invention, void formation on the bonded cross-sectional surface can be controlled even in an accelerated test of 150° C.-3000 h, thereby satisfying a bonding reliability with a favorable bonding strength in the corresponding test. Here, the accelerated test of 150° C.-3000 h is a standard of an HTS test intended for a vehicle-mounted LSI, which is stricter than that of a normal evaluation. Further, if the aforementioned ratio R1 is not lower than 70%, the bonding reliability can be satisfied even under a stricter standard of the vehicle-mounted LSI evaluation of 150° C.-4000 h.

It is efficient to analyze the intermetallic compounds in the ball-bonded portion after performing a heat treatment on the semiconductor. The analyses of the intermetallic compounds in a normal semiconductor have been difficult due to the fact that the intermetallic compounds in the ball-bonded portion formed of the copper bonding wire and the Al electrode grow at slow growth rates. Advantages of performing the heat treatment include, for example, the fact that analysis accuracies of the intermetallic compounds can thus be improved as the growths of the intermetallic compounds are facilitated, and the fact that there can be achieved a more accurate comprehension of the bonding reliabilities required for the practical use of the semiconductor and the reliability test.

It is relatively easy to facilitate the growths of the intermetallic compounds as long as any temperature between 130° C. and 200° C. is used for heating. This is because the interdiffusion speed of Cu and Al atoms in the bonded interface can be increased if heated in the range of 130° C.-200° C. A proper temperature and a proper heating time can be selected based on a semiconductor structure and the required standards of the reliability. Further, it is desired that a heating atmosphere be an arid atmosphere that is composed of air or an inert gas such as $N_2$, Ar or the like, and exhibits a humidity not higher than that under a saturation water vapor pressure.

Preferably, it is effective to use any temperature between 130° C. and 200° C. to heat a sample that is not sealed with a resin, and any temperature between 130° C. and 185° C. to heat a resin-sealed sample, for 50-2000 hours (referred to as an HTS evaluation condition hereunder). The higher the temperature rises within those ranges, the larger the growth rates of the intermetallic compounds become, thereby making it possible to perform analyses on the phases in a short period of time, thus improving an efficiency of the evaluation. The reason that an upper limit of 185° C. is set for the temperature used to heat the resin-sealed sample, is because heating at a temperature higher than 185° C. in the evaluation causes a sealing resin to be altered at an accelerated rate such that failure mechanisms other than those originally expected in the reliability evaluation of the semiconductor come into play. As for a condition for evaluating the intermetallic compounds, a concentrated layer and a Cu alloy layer that grow in the Cu/Al bonded portion described hereunder, there is employed the aforementioned HTS evaluation condition if otherwise not specified. As a more preferable HTS evaluation condition, it is desired that the sample that is not sealed with the resin be heated at 150-200° C. for 100-700 hours, and that the resin-sealed sample be heated at 150-175° C. for 200-1000 hours. Under such heating condition, a shorter period of heating allows there to be secured a sufficient thickness of the intermetallic compounds for analysis, thus enabling an efficient evaluation. According to the present invention, the ball-bonded portion can be heated either with or without the sample being encapsulated by the resin.

As for the semiconductor used to analyze the intermetallic compounds in the heated ball-bonded portion, there can be employed: an intermediate product of a semiconductor obtained in a packaging process; a finished product of a semiconductor that has been shipped; or a semiconductor that is mounted on an electronic device and is thus in practical use, as long as the semiconductor employed is wire-bonded. However, the semiconductor to be used is not limited to the aforementioned semiconductors. The intermediate product refers to a semiconductor obtained after completing wire bonding. Particularly, the intermediate product may, for example, be the sample that is not sealed with the resin, a resin-sealed sample on which the reliability test has not been performed or a resin-sealed sample on which the reliability test has been performed. That is, as long as the concentration or thickness of the intermetallic compounds formed in the bonded interface are in the ranges of the present invention even when using any one of the aforementioned semiconductors and observing the ball-bonded portion after heating the corresponding semiconductor at any temperature between 130° C. and 200° C., function effects brought about thereby can be achieved.

Here, a relative compound ratio R2 is defined as a ratio of the thickness of the intermetallic compound of the CuAl phase to the thickness of the intermetallic compounds observed on the cross-sectional surface of the ball-bonded portion and composed of Cu and Al, such intermetallic compounds being formed by heating the ball-bonded portion at any temperature between 130° C. and 200° C., and at any relative humidity (RH) between 85% and 100%, and such ball-bonded portion being formed by bonding to the aluminum electrode the ball portion formed on the front end of the copper bonding wire. Particularly, a bonding structure exhibiting an R2 of 50-100% is more preferred. A copper bonding wire having such bonding structure can further facilitate the growth of the CuAl phase, and further improve the reliability by controlling a corrosion of the Cu/Al bonded portion in a severe usage environment with a high-humidity/temperature. The reason that the ball-bonded portion is heated at 130-200° C. and 85-100% RH when evaluating the growths of the intermetallic compounds, is because this condition is desirable in terms of an accelerated evaluation satisfying the requirements of the reliability in a severe high-humidity/temperature environment. According to such high-humidity/temperature heating, an absorbed moisture serves to facilitate a chlorine migration in the encapsulation resin, thereby accelerating the corrosion reaction, thus enabling a strict reliability evaluation based on failure mechanisms other than those expected in the high-temperature heating in the arid environment.

What are considered as problems recently are the decrease in the bonding strength and the increase in the electric resistance that are observed in the ball-bonded portion when performing a high-humidity/temperature test such as a PCT, a HAST or the like on a semiconductor using the copper bonding wire. These problems are unique to the copper bonding wire, whereas a bonded portion formed of a gold bonding wire does not exhibit failures. After closely studying the failure mechanisms, the inventors identified as cause a corrosion reaction taking place due to a chemical reaction between chlorine, sodium or the like contained in the encapsulation resin and the Cu—Al-based intermetallic compounds grown in the bonded interface. Such corrosion failure is dominated by a chemical reaction, and is a new failure exhibiting a mechanism different from that of void coarsening.

It was found that the growth facilitation of the CuAl phase grown through the high-humidity/temperature heating was effective in controlling the corrosion reaction of the ball-bonded portion. It is assumed that while chlorine, sodium or the like induces the corrosion failure under the high-humidity/temperature heating, the CuAl phase is a phase that is not easily corroded. This is the reason why the inventors focused on the relative compound ratio R2 defined as the ratio of the thickness of the intermetallic compound of the CuAl phase. The bonding reliability in terms of practical use and in the reliability test can be further improved by allowing the CuAl phase to preferentially grow under the high-humidity/temperature heating.

The reason that the ball-bonded portion is heated at 130-200° C. and 85-100% RH when evaluating the growths of the intermetallic compounds, is because this condition is desirable in terms of an accelerated evaluation satisfying the requirements of the reliability in a severe high-humidity/temperature environment.

Preferably, it is desired that the relative compound ratio R2 be not lower than 60% and not higher than 100% after heating the ball-bonded portion at the temperature of 130° C. and the relative humidity of 85%, such relative compound ratio R2 being defined as the ratio of the thickness of the intermetallic compound of the CuAl phase to the thickness of the intermetallic compounds observed on the cross-sectional surface of the ball-bonded portion and composed of Cu and Al. Since the temperature condition of 130° C. is substantially as same as a glass-transition temperature of a normal encapsulation resin, it is suitable for use in an evaluation dealing with possible failures in a practical setting. Further, since the humidity condition of 85% RH serves to balance an improvement in a water absorbability inside the resin with a control of an excessive dew condensation on a resin surface, the corresponding humidity condition is suitable for restricting a degree of the corrosion failure from varying inside the semiconductor. Accordingly, since the heating condition of 130° C.-85% RH (referred to as a UHAST evaluation condition hereunder) allows the growths of the intermetallic compounds and the corrosion reaction to progress simultaneously, it is suitable for reproducing the practical setting and the reliability test. That is, it is more desirable that the high-humidity/temperature heating condition under which the ratio R2 is evaluated be the condition of 130° C. temperature, 85% RH humidity.

As long as a heating time for evaluating the ratio R2 is within a range of 150-1000 hours, there can be grown the intermetallic compounds with a sufficient thickness needed to evaluate the bonding reliability. Preferably, 200-600 hours of heating allows there to be secured a sufficient thickness of the intermetallic compounds for analyses such as identifications of phases or the like, and obtained less corrosion reaction products or the like, thus enabling an efficient evaluation.

Here, the heating condition of 130° C.-85% RH is equivalent to that of a HAST with no bias, and has thus gained attention as a condition for the UHAST evaluation (Un-biased HAST). The high-humidity/temperature tests performed on the conventional gold bonding wire generally include, for example, the PCT (121° C.-100% RH, no bias) and the HAST (130° C.-85% RH, with bias load). The problem with the PCT is that the conditions thereof lead to large variations in a reliability data, thus resulting in a poor reproducibility in a life evaluation. As for the HAST, a concern is that a high acceleration factor is resulted due to the bias load, thus making it impossible for the failure mechanisms in the practical setting to be reproduced. As conditions suitable for evaluating the reliability of the copper bonding wire, the inventors of the present invention confirmed that the conditions of the UHAST were effective in the sense that they result in small variations in the lives and enable a proper evaluation of the reliability. As for the high-humidity/temperature heating evaluation, it is desired that the ball-bonded portion be encapsulated by the resin, thus making it possible to reproduce and then evaluate the corrosion failure.

Since the aforementioned relative compound ratio R2 is not lower than 50%, there can be achieved a high effect of controlling the progression of corrosion in the ball-bonded portion. Particularly, a favorable bonding strength was confirmed as a result of controlling corrosion on the bonded cross-sectional surface, even when heated for 192 hours (8 days) in the HAST (130° C.-85% RH, with bias load) intended for semiconductors with relatively high reliability requirements. This is equivalent to 300 hours of heating in the UHAST (130° C.-85% RH, no bias). Further, if the ratio R2 is not lower than 70%, a favorable bonding reliability can be satisfied even when heated for 336 hours (14 days) in the HAST, which is a stricter standard. This is equivalent to 500 hours of heating in the UHAST.

There is desired a bonding structure exhibiting the following ratio after being heated under the aforementioned conditions. That is, in the ball-bonded portion, it is desired that a ratio of a total thickness of the intermetallic compounds of the $Cu_9Al_4$ and $CuAl_2$ phases to the thickness of the intermetallic compounds composed of Cu and Al, be not lower than 0% but lower than 40%. Heating in this case is performed at any temperature between 130° C. and 200° C., or performed at any temperature between 130° C. and 200° C., and at any relative humidity between 85% and 100%. As for the ratio (R3, R4) of the total thickness of the intermetallic compounds of the $Cu_9Al_4$ and $CuAl_2$ phases, R3 is distinguished, for the sake of convenience, from R4 in that while R3 represents a ratio obtained under the former heating condition, R4 represents that obtained under the latter heating condition.

After earnestly studying the failure mechanisms in the Cu/Al bonded portion, it was found that specific phases of the intermetallic compounds composed of Cu and Al contributed to void formation and corrosion reaction, and that the $Cu_9Al_4$ and $CuAl_2$ phases in particular were susceptible to void formation and corrosion reaction. That is, the $Cu_9Al_4$ and $CuAl_2$ phases are the main phases contributing to voids and corrosion, and the effect of improving the reliability of the ball-bonded portion can be improved by controlling the growths of the corresponding phases. A higher synergistic effect of controlling voids and corrosion in particular can be achieved by a combination of: the growth controls of the $Cu_9Al_4$ and $CuAl_2$ phases when heated under the aforementioned conditions; and the growth facilitation of the aforementioned CuAl phase.

Here, the ratio R3 is defined as the ratio of the total thickness of the intermetallic compounds of the $Cu_9Al_4$ and $CuAl_2$ phases in the ball-bonded portion to the thickness of the intermetallic compounds composed of Cu and Al therein, such ball-bonded portion having been heated at any temperature between 130° C. and 200° C. A bonding structure exhibiting an R3 of not lower than 0% but lower than 40%, allows there to be achieved a superior effect of further controlling void formation, thus further improving the high-temperature bonding reliability. It is assumed that the growths of the $Cu_9Al_4$ and $CuAl_2$ phases when heated at a high temperature facilitate the coarsening of the voids. Further, a synergistic effect of controlling void formation can be achieved by a combination of: the growth facilitation of the CuAl phase;

and the growth controls of the $Cu_9Al_4$ and $CuAl_2$ phases when heated at any temperature between 130° C. and 200° C. If the ratio R3 is less than 40%, a favorable bonding reliability can be achieved even when heated at 150° C. for 4000 hours in the HTS test, which is a strict standard intended for a vehicle-mounted LSI. Preferably, if the ratio R3 is less than 15%, a high bonding reliability can be satisfied even when heated for 4500 hours in the HTS test, which is a stricter standard intended for a vehicle-mounted LSI.

Here, the ratio R4 is defined as the ratio of the total thickness of the intermetallic compounds of the $Cu_9Al_4$ and $CuAl_2$ phases in the ball-bonded portion to the thickness of the intermetallic compounds composed of Cu and Al therein, such ball-bonded portion having been heated at any temperature between 130° C. and 200° C., and at any relative humidity between 85% and 100%. A copper bonding wire exhibiting an R4 of not lower than 10% but lower than 40% brings about a superior effect of further controlling corrosion in the ball-bonded portion, thus further improving the high-humidity/temperature bonding reliability. Preferably, it is desired that the UHAST evaluation condition of 130° C.-85% RH be employed, such UHAST evaluation condition being a heating condition mentioned above. Under such UHAST evaluation condition, there can be simultaneously reproduced corrosions and the growths of the $Cu_9Al_4$ and $CuAl_2$ phases, thus further improving an accuracy and efficiency in evaluating the ratio R4.

If the ratio R4 is less than 40%, a favorable bonding reliability can be satisfied even when subjected to the HAST for 288 hours (12 days), which is a strict standard intended for a vehicle-mounted LSI. Preferably, if the ratio R4 is less than 15%, a favorable bonding reliability can be satisfied even when subjected to the HAST for 408 hours (17 days), which is a stricter standard intended for a vehicle-mounted LSI.

Figure 2:
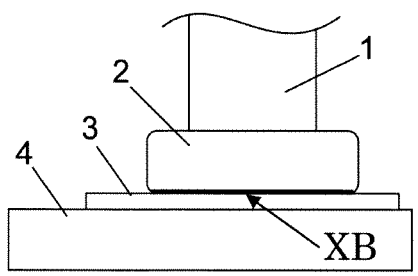
FIG. 2 is a cross sectional view showing one of exemplary bonding structures.

It is desired that the aforementioned bonding structure have a concentrated layer XB (see FIG. 2) formed in the ball-bonded portion and containing at least one of Pd, Au and Ag serving as electrically-conductive metals, in a high concentration. Here, a sample used to evaluate the concentrated layer can be, for example, either a sample heated at any temperature between 130° C. and 200° C., or a sample heated at the corresponding temperature and at 85-100% RH. The aforementioned copper bonding wire allows the relative compound ratio of the CuAl phase in the ball-bonded portion to be controlled, thereby improving the bonding reliability in the HTS test of 175° C.-3000 h, which is a reliability standard intended for future vehicle-mounted LSIs. It is assumed that the concentrated layer formed in the ball-bonded portion and composed of Pd, Au and/or Ag serves to, for example, facilitate the growth of the CuAl phase and control void coarsening, by adjusting the interdiffusion speed of Cu and Al atoms. The concentrated layer of Pd, Au and/or Ag is less likely to be oxidized due to the fact the Pd, Au and Ag are metals nobler than Cu and Al. For this reason, there can also be expected a protective effect of controlling, for example, migrations of a corrosive gas, ions or the like in the vicinity of the bonded interface.

The aforementioned concentrated layer refers to a region with a concentration of the electrically-conductive metal(s) relatively higher than that of the corresponding electrically-conductive metal(s) in a center section of the ball-bonded portion. The function of improving the reliability can be improved by allowing the concentrated layer to exist in the vicinity of the interface of the ball-bonded portion. Further, even when the concentrated layer exists in a location inside the ball that is slightly distant from the interface, the aforementioned electrically-conductive metal(s) are supplied to the interface from the corresponding concentrated layer through diffusion, thereby making it possible to improve the reliability. It is preferred that the concentration of the electrically-conductive metal(s) contained in the concentrated layer be not less than 1.2 times higher than the concentration in the center section of the ball-bonded portion, thus achieving a high effect of the concentrated layer. More preferably, if the corresponding ratio is not less than 2, the improvement effect of the concentrated layer can be further improved. The present application uses the term "concentrated layer" because the concentration in the interface or on a surface of the ball-bonded portion is often observed in the form of a layer. However, the concentrated layer does not necessarily have to be and is not limited to a continuous layer. In fact, part of the concentrated layer may be formed discontinuously (interspatially). The electrically-conductive metal(s) exist in the concentrated layer either in a manner such that the corresponding electrically-conductive metal(s) are dissolved in Cu, or in a manner such that there is formed an intermetallic compound(s) composed of: at least one of the corresponding electrically-conductive metal(s); Cu; and Al.

It is desired that the concentrated layer exhibit: a highest concentration of 0.1-30 mol % based on a grand total of the aforementioned electrically-conductive metal(s); and a thickness of 0.1-15 μm. This is because of the fact that a highest concentration of less than 0.1 mol % results in a small effect of improving the reliability, and a concern that a highest concentration of greater than 30 mol % may cause the ball portion to be hardened and possible chip damages. Preferably, a highest concentration of 0.5-12 mol % allows an initial bonding strength to be improved even when using a sample obtained through a low-temperature bonding performed at a temperature not higher than 150° C., thereby advantageously enabling a connection to a resin substrate such as BGA, CSP or the like. When the thickness of the concentrated layer is not smaller than 0.1 μm, there can be achieved the aforementioned effect of improving the reliability. However, when the thickness of the concentrated layer is larger than 15 μm, there arises the concern of causing possible chip damages. Preferably, when the thickness of the concentrated layer is within a range of 0.5-10 μm, there can be achieved a higher effect of extending the life of the ball-bonded portion heated at a high temperature.

It is desired that the aforementioned bonding structure have intermetallic compounds (referred to as "multi-element intermetallic compounds" hereunder) that are formed in the ball-bonded portion subjected to the heating evaluation, and composed of: at least one of Pd, Au and Ag serving as electrically-conductive metals; Cu; and Al. Further, it is desired that such multi-element intermetallic compounds be formed in the vicinity of the interface of the ball-bonded portion. A multi-element intermetallic compound can be composed of, for example, three kinds of elements such as Cu—Al—Pd, Cu—Al—Au or the like. A multi-element intermetallic compound can also be composed of, for example, four kinds of elements such as Cu—Al—Pd—Ag, Cu—Al—Pd—Au or the like. Further, an intermetallic compound formed by allowing the aforementioned electrically-conductive metal(s) to be dissolved in an intermetallic compound composed of Cu and Al, is also considered as a multi-element intermetallic compound. The bonding structure with such multi-element intermetallic compounds formed in the ball-bonded portion, improves the effect of controlling corrosion in the Cu/Al bonded portion under the high-humidity/temperature environment, thereby further improving the bonding reliability in the HAST of 480 hours (20 days). This standard is significantly equivalent to the UHAST of 600 hours (25 days). The multi-element intermetallic compounds have a barrier function for interdiffusion of Cu and Al atoms, thereby facilitating stable growth of the CuAl phase and achieving a high effect of controlling the growths of the $Cu_9Al_4$ and $CuAl_2$ phases that are highly susceptible to corrosion. Further, one function unique to the multi-element intermetallic compounds is that the multi-element intermetallic compounds can prevent chlorine, sodium or the like from entering the bonded interface, thus further improving the effect of controlling corrosion.

It is desired that a highest concentration of all the electrically-conductive metals contained in the multi-element intermetallic compounds be 0.5-20 mol %. That is, the aforementioned high corrosion-control effect can be achieved when the corresponding concentration is not lower than 0.5 mol %. However, a concentration of higher than 20 mol % may cause an under section of the aluminum electrode to be damaged upon heating. It is desired that a thickness of the multi-element intermetallic compounds be 0.02-3 μm. The aforementioned effect of improving the reliability can be achieved when the corresponding thickness is not less than 0.05 μm within the aforementioned concentration range. However, chip damages may occur if the corresponding thickness is greater than 3 μm. Preferably, a thickness range of 0.05-2 μm can improve the bonding reliability in the high-humidity/temperature environment even when a film thickness of the aluminum electrode is not larger than 0.7 μm.

It is desired that the aforementioned bonding structure have a Cu alloy layer containing at least one of Pd, Au and Ag serving as electrically-conductive metals in a total concentration of up to 0.5-30 mol %. Here, the Cu alloy refers to a state in which the aforementioned electrically-conductive metal(s) are dissolved in Cu. Particularly, a crystal structure of the Cu alloy is still a face-centered structure which is as same as that of Cu. Therefore, it is obvious that the Cu alloy is different from the aforementioned intermetallic compounds. This bonding structure can improve the bonding reliability in the HTS test. performed for 1000 hours and at a temperature of 200° C. which is higher than the glass-transition temperature of the encapsulation resin. This condition is equivalent to a strict reliability standard intended for a vehicle-mounted LSI disposed on a periphery of an engine. Since the Cu alloy layer has a function of controlling the diffusion of Cu, it is assumed that the effect of controlling void formation can thus be enhanced. While a high effect of improving the reliability can be achieved if the Cu alloy layer is formed in the vicinity of the bonded interface, the Cu alloy layer may also exist inside the ball-bonded portion.

It is desired that the highest concentration of all the electrically-conductive metals contained in the Cu alloy layer be 0.5-30 mol %. That is, the aforementioned high effect of controlling voids can be achieved when the corresponding concentration is not lower than 0.5 mol %. However, a concentration of higher than 30 mol % may cause cracks to occur in the vicinity of an outer circumference of the ball portion, due to, for example, a difference in thermal expansion with respect to adjacent intermetallic compounds. Preferably, a concentration of 0.5-12 mol % leads to, for example, a favorable bondability at a low temperature and a favorable small-ball bondability. It is preferred that a thickness of the Cu alloy layer be not smaller than 0.1 μm. Here, a thickness of not smaller than 0.1 μm brings about the effect of improving the reliability. Preferably, a thickness of not smaller than 1 μm leads to an improvement in the bonding reliability at a high temperature, even when the aluminum electrode has a thick film thickness of not smaller than 1.8 μm. Further, a favorable bondability can be ensured without causing an adverse effect on the corresponding bondability or the like, if an upper limit of the thickness of the Cu alloy layer is not larger than 60% of a pressed height of the ball-bonded portion, or not larger than 40% of a ball diameter.

It is desired that the aforementioned copper bonding wire have a wire diameter of 10-75 μm. Preferably, a wire diameter of 10-30 μm is effective in improving a reliability for a high-density packaging. More preferably, without undermining workabilities, a wire diameter of 12-25 μm can lead to improvements in performances including, for example: narrow-pitch bonding; complex loop control; and restriction of wire deformation when performing resin encapsulation. As for a size of the ball-bonded portion, there can be ensured a favorable bonding reliability when an average value of a diameter of the ball-bonded portion is 1.2-3.5 times larger than the wire diameter. Preferably, there can be improved a mass-production yield in a continuous bonding, if the average value of the diameter of the ball-bonded portion is 1.4-3 times larger than the wire diameter. More preferably, there can be easily improved the bonding reliability in the low-temperature bonding performed on the BGA substrate, when the average value of the diameter of the ball-bonded portion is 1.5-2.5 times larger than the wire diameter.

It was confirmed that there could be ensured a favorable bonding reliability, if a material composing the aluminum electrode to be bonded was either pure Al or an Al alloy. Here, an Al alloy can be, but is not limited to Al-1% Si, Al-0.5% Cu or Al-1% Si-0.5% Cu. Here, it is desired that the film thickness of the aluminum electrode be 0.4-4 μm. Preferably, a film thickness of 0.5-2 μm restricts a failure (splash failure) in which a periphery of a bonded portion is splashed with aluminum, thus improving the bondability and the reliability. Further, it was confirmed that there could be ensured a favorable bonding reliability, even when a lower structure of the aluminum electrode was a multilayer structure composed of, for example, a metal film, a dielectric film and an oxide film.

The phases of the intermetallic compounds grown in the bonded interface, can be effectively identified through electron diffraction or concentration analysis by TEM (Transmission Electron Microscope). As for a concentration analysis of the intermetallic compounds, the concentrated layer, the Cu alloy layer or the like, there can be performed either point analysis or line analysis on the bonded cross-sectional surface, using EPMA (Electron Probe Microanalyser), EDX (Electron Probe Micro Analyser), AES (Auger Electron Spectroscopy) or the like. Particularly, when the aforementioned phases are thin due to insufficient diffusion, AES analysis, high-resolution TEM analysis or the like are effective in terms of improving a precision of analysis in a microscopic region. As for an analysis of the interface of the ball-bonded portion, there were used devices including AES, EPMA, EDX, TEM and the like. It is desired that line analysis be performed in the vicinity of the bonded interface, if a region(s) of concentration cannot be identified. However, point analysis as an easier method can be performed, if the location(s) of the concentrated layer are clear. In order to evaluate a presence of concentration through point analysis, it is desired that analyses be performed in at least two locations including: the region(s) of concentration; and a region(s) that are inside the ball-bonded portion and are sufficiently distant from the bonded interface. Further, thicknesses of products in the interface can be evaluated mainly through line analyses effected by AES, EPMA or EDX, or through photographs taken by, for example, SEM (Scanning Electron Microscope), TEM and an optical microscope.

As for a region in the bonded interface used to study the presences or a thickness of the intermetallic compounds, the concentrated layer, compounds or the like, it is desired that there be used a center region of the cross-sectional surface of the ball-bonded portion, the center region not including regions adjacent to both ends of the cross-sectional surface of the ball-bonded portion. Here, the center region refers to a region occupying 70% of the ball-bonded cross-sectional surface across a centerline thereof. That is, the center region is a region obtained by excluding 15% of each end of the ball-bonded cross-sectional surface. This, for example, is because the aforementioned center region dominates the reliability of the ball-bonded portion, and the growths of the intermetallic compounds on both ends of the ball-bonded portion differ from those in the center region due to diffusion of Al atoms from the aluminum electrode on an outer circumference of the bonded portion.

As mentioned above, the copper bonding wire for semiconductor of the present invention is acceptable as long as the relative compound ratio R1 of the CuAl phase on the cross-sectional surface of the ball-bonded portion bonded to the aluminum electrode is not smaller than 50% and not larger than 100%. An example thereof is described hereunder.

Figure 3:
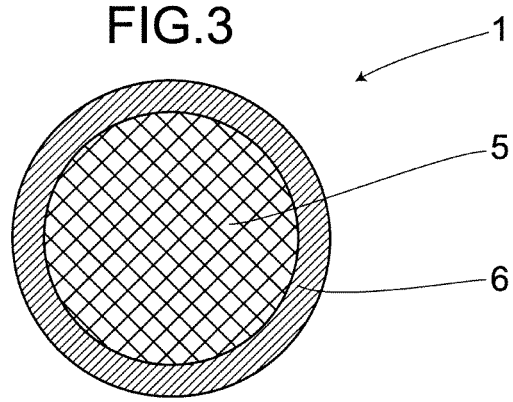
FIG. 3 is a cross sectional view showing one of exemplary copper bonding wires for a semiconductor device.

One example of the copper bonding wire exhibiting R1 of the aforementioned range when subjected to the heat treatment, is a copper bonding wire 1 shown in FIG. 3 for a semiconductor device that has: a core member 5 whose main component is copper; and an outer layer 6 that is formed on the core member 5 and whose main component includes at least one of Pd, Au and Ag serving as electrically-conductive metals. A copper bonding wire having a core member and an outer layer is collectively referred to as a multilayer copper bonding wire hereunder. Here, the term "main component" refers to a concentration of not lower than 50 mol %.

As for the aforementioned multilayer copper bonding wire, a multilayer copper bonding wire exhibiting R1 of the aforementioned range easily allows the growth of the CuAl phase to be facilitated, thus achieving a superior bonding reliability. Further, the multilayer copper bonding wire exhibiting R1 of the aforementioned range allows the growths of the $Cu_9Al_4$ and $CuAl_2$ phases to be controlled, thereby facilitating the growths of, for example, the concentrated layer(s) of the electrically-conductive metal(s), the multi-element intermetallic compounds and the Cu alloy layer, thus achieving a further superior bonding reliability. In addition, the multilayer copper bonding wire allows a product life thereof to be improved by controlling an oxidation on a wire surface. By appropriately adjusting the thickness of the outer layer, the composition, the structure or the like, the multilayer copper bonding wire can advantageously bring about, for example: the effect of improving the product life thereof as a result of controlling the oxidation on the wire surface; and an effect of reducing chip damages. Meanwhile, the conventional copper bonding wire of a single layered structure does not exhibit R1 of the aforementioned range. According to the conventional copper bonding wire of the single layered structure, an added concentration of an alloy element(s) in the wire has to be increased in order to obtain R1 of the aforementioned range, i.e., to facilitate the growths of intermetallic compounds of particular phases such as the CuAl phase. However, in fact, increasing such a kind of added concentration leads to a failure of forming the ball-bonded portion. This is because a hardened ball portion causes chip damages to occur when performing bonding.

The main component of the aforementioned outer layer includes at least one of Pd, Au and Ag serving as electrically-conductive metals. Further, R1 is set to be within the aforementioned range. Therefore, there can be achieved a noticeable effect of improving the bonding reliability as a result of facilitating the growth of the CuAl phase. Further, there can also be achieved an effect of forming the ball-bonded portion into the shape of a true circle due to an isotropic deformation at the time of performing ball bonding. Preferably, the outer layer containing Pd can further improve the effect of forming the ball-bonded portion into the shape of a true circle.

Figure 4:
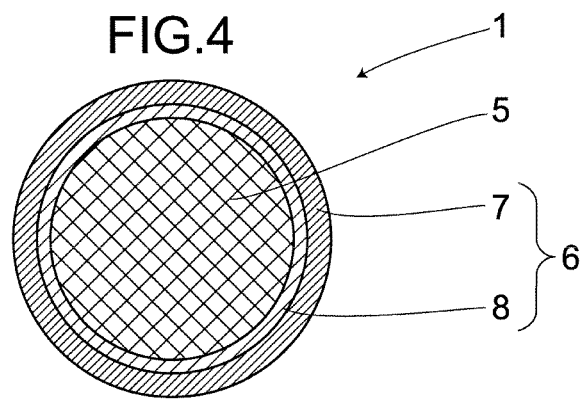
FIG. 4 is a cross sectional view showing one of exemplary copper bonding wires for a semiconductor device.

As shown in FIG. 4, the aforementioned outer layer, in terms of the number of the elements composing the same, can be a single metal outer layer 8 composed of one of the aforementioned electrically-conductive metals, an alloy outer layer 7 composed of at least two of the aforementioned electrically-conductive metals or a combined outer layer combining both the single metal outer layer 8 and the alloy outer layer 7. Here, regardless of whether the outer layer is a single metal outer layer, an alloy outer layer or a combined outer layer, as long as R1 is within the aforementioned range, the growth of the CuAl phase is facilitated, thus improving the reliability of the ball-bonded portion. Following are the properties of the aforementioned types of outer layers. It was confirmed that the single metal outer layer tended to facilitate the formation of the concentrated layer in the bonded interface, and that the alloy outer layer tended to facilitate the formation of the multi-element intermetallic compounds. Further, since the alloy outer layer has concentration gradients of at least two of the aforementioned electrically-conductive metals, the alloy outer layer is advantageously effective in, for example, improving a wedge bonding strength at a low temperature, and restricting a leaning failure in which wires fall when performing a bonding between highly different levels.

It is desired that the outer layer have a thickness of 0.01-0.4 µm. This is because the thickness of 0.01-0.4 µm brings about a favorable wedge bondability, and an effect of further improving a ball bondability. Here, a thickness of less than 0.01 µm may result in an insufficient control of oxidation on the surface of the copper bonding wire, and an insufficient bonding reliability caused thereby. Meanwhile, a thickness of greater than 0.4 µm may cause the ball portion to be hardened and result in chip damages accordingly. Preferably, when the outer layer has a thickness of 0.02-0.3 µm, there can be achieved an effect of further improving the wedge bonding strength at a low temperature. More preferably, if the outer layer has a thickness of 0.04-0.2 µm, there can be ensured both a control of surface oxidation and an improvement in the wedge bondability when employing a thin wire having a wire diameter of not larger than 18 µm, thus improving a productivity when performing narrow-pitch bonding with a pitch of not larger than 45 µm.

It is desired that a diffusion layer having a concentration gradient in a wire radial direction, be formed between the core member and the outer layer. The diffusion layer thus formed brings about an effect of simultaneously improving a loop controllability and the wedge bondability, which has been considered as hardly compatible. Here, the diffusion layer is formed through a process in which the element composing the core member and the element(s) composing the outer layer diffuse toward each other in opposite directions. That is, the diffusion layer is composed of: Cu; and at least one of Pd, Au and Ag serving as electrically-conductive metals. Preferably, since the diffusion layer has the concentration gradient in the wire radial direction, there can be simultaneously improved an adhesion between the core member and the outer layer, and a loop controllability when subjected to a complex plastic deformation. The definition of the diffusion layer of the present invention is as follows. That is, in terms of productivity or the like, or properties such as adhesion, strength, looping capability or the like, a detected concentration of the aforementioned electrically-conductive metal(s) is set to be 10-50 mol %. This is because the diffusion layer of such concentration range exhibits a low concentration and thereby plays a role different from those of the outer layer and the core member. Further, the outer layer is a highly concentrated section exhibiting a detected concentration of the electrically-conductive metal(s) of not lower than 50 mol %. Here, as for the concentrations of the outer layer and the diffusion layer, there is employed a concentration ratio obtained with a total of the metal elements composing the outer layer and the core member. Further, there is used a concentration value calculated while excluding, for example: non-metal element(s); and gas elements in the vicinity of the surface, such as C, O, N, H, Cl, S or the like.

It is desired that the diffusion layer have a thickness of 0.002-0.2 µm. This is because while a thickness of smaller than 0.002 µm results in a small effect of stabilizing loop control, a thickness of larger than 0.2 µm problematically causes core deviation, excessive deformation or the like in the ball-bonded portion. Preferably, a thickness of 0.002-0.08 µm brings about an effect of further improving the loop controllability.

It is desired that the outer layer of the multilayer copper bonding wire have: the single metal outer layer composed of one of Pd, Au and Ag serving as electrically-conductive metals; and the alloy outer layer whose main component includes at least two of the aforementioned electrically-conductive metals. Such a kind of outer layer is equivalent to the aforementioned combined outer layer. Since there are formed both the single metal outer layer and the alloy outer layer, there can be improved a leaning property which is a mode of failure at the time of forming high loops. Further, it is expected that, in multi-tier bonding using multiple pins, there can be corrected a leaning failure in which the wire falls in the vicinity of a neck portion when forming high loops.

As for the structure of the combined outer layer, it is preferred that the alloy outer layer composing the outermost surface cover the single metal outer layer. The structure of alloy outer layer/single metal outer layer/core member brings about a high effect of improving the leaning property. It is assumed that the reason for that is because the alloy outer layer and the single metal outer layer play different roles. Particularly, the alloy outer layer on the surface serves to control coarsening of recrystallized grains, the recrystallized grains being coarsened due to a thermal effect of a melting ball. Meanwhile, the single metal outer layer on the inner side serves to restrict non-uniformity of deformation, the non-uniformity resulting from, for example, residuals of non-uniform strains that are formed at the time of forming loops. More preferably, the effect of leaning control can be significantly improved, if two or more elements of the aforementioned electrically-conductive metals have concentration gradients in an inner side of the alloy outer layer and in an interface between the alloy outer layer and the single metal outer layer. It is assumed that this is because the concentration gradients improve an effect of reducing an external force when forming loops, thus further improving the effect of leaning control. As for a combination of the elements, it was confirmed that a significantly high effect of leaning control could be achieved when the single metal outer layer is composed of Pd, and the alloy outer layer is composed of an alloy of Pd and Au; and when the single metal outer layer is composed of Pd, and the alloy outer layer is composed of an alloy of Pd and Ag. While there are no specific limits on the thicknesses of the alloy outer layer and the single metal outer layer, a stable improvement effect can be achieved as long as the single metal outer layer is two or more times thicker than the alloy outer layer.

With regard to the multilayer copper bonding wire, a copper bonding wire exhibiting R1 of 50-100% after the aforementioned heat treatment, can be obtained by appropriately adjusting bonding wire manufacturing conditions including, for example: conditions of coating procedures for forming the core member and the outer layer; and conditions of heating procedures. In order for the bonding reliability between the copper bonding wire and the Al electrode to satisfy strict requirements of a use of semiconductor, it is not sufficient to simply increase an average value of the reliability, but also critical to restrict variations such that a defective fraction in the accelerated test is reduced to a ppm order. There is demanded a copper bonding wire capable of restricting the variation of and stabilizing the ball-bonded portion at a mass production level. That is, it is critical to allow the diffusion between Cu and Al to uniformly take place in the entire bonded interface, in order to control the relative compound ratios R1, R2, R3 and R4 that are related to the CuAl, $Cu_9Al_4$ and $CuAl_2$ phases in the cross-sectional surface of the ball-bonded portion. In other words, there is demanded a manufacturing technique of copper bonding wire, capable of controlling instability factors in the bonded interface to a maximum extent. For example, R1, R2, R3 and R4 can fall within the ranges of the present invention as a result of, for example, improving a uniformity and adhesion at the interface between the outer layer and the core member, reducing a surface roughness of the outer layer or reducing an amount of impurities contaminating the outer layer. Accordingly, there can be improved the function of controlling the diffusion in the ball-bonded portion, thus bringing about an effect of stably improving the bonding reliability.

With regard to the multilayer copper bonding wire, wire-material factors mainly affecting R1 include, for example: the thickness and uniformity of the outer layer; impurity components and their concentrations; processing strain; surface roughness; the adhesion and uniformity at the interface between the outer layer and the core member. Here, R1 can be effectively increased by, for example, increasing the thickness of the outer layer, reducing the amount of impurities, improving the adhesion and the uniformity at the interface between the outer layer and the core member, and uniformly forming the diffusion layer. It is easier to obtain R1 of the range of the present invention of 50-100%, by appropriately combining the aforementioned material factors with one another. Preferably, it is easier to obtain R1 of a preferable range of the present invention of 70-100%, by improving the adhesion and uniformity at the interface between the outer layer and the core member. And, it is also easy to obtain R2 of the range of the present invention of 50-100%, by increasing the thickness of the outer layer and facilitating a uniformity of the corresponding thickness.

With regard to the multilayer copper bonding wire, wire-material factors affecting R3 are substantially identical to those affecting R1. Here, R1 tends to increase when the impurity components and the concentrations thereof are controlled. Particularly, among the impurities, controlling plating liquids, organic residuals, hydrogen gas components or the like is effective in obtaining R3 of the range of the present invention of not lower than 0% but lower than 40%. Preferably, controlling the organic residuals is effective in obtaining R3 of the preferable range of the present invention of not lower than 0% but lower than 40%. And, controlling the hydrogen gas components is effective in stably obtaining R4 of the range of the present invention of not lower than 0% but lower than 40%.

There is described hereunder an example of a set of process conditions for manufacturing the multilayer copper bonding wire exhibiting R1 of the range of the present invention, and R2 through R4 of the specific ranges. Particularly, there are described later, for example, correlations among the process conditions and the aforementioned material factors, under processes including manufacturing of the core member, coating of the outer layer, drawing, heat treatment or the like. Further, the effect of controlling R1 through R4 can be further improved by appropriately combining the following process conditions with one another.

In a process of preparing the core member of Cu, the adhesion between the core member and the outer layer can be improved by improving a surface smoothness of the core member or controlling a surface oxide film of the core member, thus making it possible to manufacture a copper bonding wire with an improved bonding reliability. The copper bonding wire thus manufactured allows the electrically-conductive metal(s) composing the outer layer to be uniformly distributed on the surface of and inside the ball, thereby stabilizing the diffusion between Cu and Al atoms in the ball-bonded portion, thus obtaining R1 of 50-100%.

As for a process of coating the surface of the copper core member with the outer layer through plating or evaporation coating, it is required that the amount of impurities contaminating the outer layer be reduced. By strictly controlling, for example, the plating liquids, the organic residuals and a dissolving of a gas component such as hydrogen inside the outer layer, melting and mixing between the outer layer and the core member can be stabilized when forming the ball through an arc discharge, thereby obtaining a copper bonding wire with an improved bonding reliability. The copper bonding wire thus manufactured allows the electrically-conductive metal(s) composing the outer layer to be uniformly distributed on the surface of and inside the ball, thereby stabilizing the diffusion between Cu and Al atoms in the ball-bonded portion, thus obtaining R1 of 50-100%. Further, reducing the plating liquids and the organic residuals leads to controlling factors inhibiting the diffusion, and to thereby controlling the growths of the $Cu_9Al_4$ and $CuAl_2$ phases, thus effectively allowing R3 to be within the range of the present invention of not lower than 0% but lower than 40%. Preferably, reducing the organic residuals in the outer layer leads to controlling factors inhibiting the diffusion in a high-temperature environment, thus effectively allowing R3 to be within the preferable range of not lower than 0% but lower than 40%. Further, reducing a gas component such as hydrogen or the like leads to controlling factors inhibiting the diffusion in a high-humidity/temperature environment with, for example, a temperature of 130° C. and a relative humidity of 85%, thus effectively allowing R4 to be within the range of not lower than 0% but lower than 40%.

As for the drawing process performed after coating the surface of the core member with the outer layer, it is effective, for example, to stably control a processing rate and to control a uniformity in the processing strain that occurs in the copper bonding wire at the time of drawing. That is, equalizing the thickness of the outer layer in a circumferential direction and a wire longitudinal direction, or improving the uniformity of the interface between the outer layer and the core member, can lead to improvements in sphericity and surface smoothness of the ball, thus making it possible to manufacture a copper bonding wire with an improved bonding reliability. The copper bonding wire thus manufactured allows the sphericity and surface smoothness of the ball to be stabilized, and equalizes the diffusion by facilitating metal joining in the entire bonded interface as a result of destroying the oxide film of the aluminum electrode, thereby effectively allowing R1 to be within the range of 50-100%. Further, equalizing the thickness of the outer layer leads to a uniform distribution of the electrically-conductive metal(s) composing the outer layer, inside the ball. As a result, there can be facilitated the diffusion between Cu and Al in the high-humidity/temperature environment with, for example, the temperature of 130° C. and the relative humidity of 85%, such high-humidity/temperature environment resulting from bonding. Accordingly, there can be effectively obtained R2 of 50-100%.

As for the heat treatment performed, for example, in the middle of processing the copper bonding wire or after the copper bonding wire has been drawn to a final diameter, a copper bonding wire with an improved bonding reliability can be manufactured by controlling, for example, a heating atmosphere, a heating temperature/time and a cooling method. The copper bonding wire thus manufactured allows there to be controlled, for example: a gas concentration inside the outer layer; the surface roughness; the adhesion at the interface between the outer layer and the core member; and the formation of the diffusion layer, thereby controlling, for example, the distribution and diffusion of the electrically-conductive metal(s) in the vicinity of the interface of the ball-bonded portion, thus effectively allowing R1 to be within the range of 50-100%. Further, the copper bonding wire thus manufactured allows the diffusion between Cu and Al in a high-humidity/temperature environment to be easily facilitated, thus also making it possible to allow R2 to be within the range of 50-100%. Furthermore, the copper bonding wire thus manufactured is also highly effective in controlling factors inhibiting the diffusion, thereby also making it possible to allow R3 to be within the range of the present invention of not lower than 0% but lower than 40%.

Figure 5:
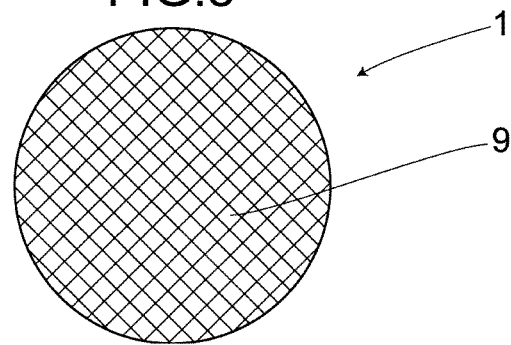
FIG. 5 is a cross sectional view showing one of exemplary copper bonding wires for a semiconductor device.

As shown in FIG. 5, the copper bonding wire 1 of the single layered structure (referred to as "single-layered copper bonding wire" hereunder) can have the bonding reliability thereof improved through the facilitation of the growth of the CuAl phase, if this copper bonding wire 1 is made of a copper alloy 9 containing at least one of Pd, Au and Ag serving as electrically-conductive metals, and R1 is within the range of 50-100%. While the aforementioned multilayer copper bonding wire requires, for example: an increase in a manufacturing cost due to the formation of the outer layer; and a material development aimed at seeking quality stability, the single-layered copper bonding wire containing the electrically-conductive metal(s) can be manufactured relatively easily, which is an advantage thereof.

Among the aforementioned copper bonding wires, it is desired that the copper bonding wire contain at least one of the aforementioned electrically-conductive metals by 0.1-3 mol %. This concentration range allows a shear strength of the ball-bonded portion to be improved. This concentration range is applicable even when employed in an electrode structure or the like that is susceptible to damages, where there are restrictions on ranges of conditions such as load, ultrasonic wave or the like. With regard to both the multilayer copper bonding wire and the single-layered copper bonding wire, the aforementioned electrically-conductive metal(s) are dissolved inside the ball portion formed by melting the wire, thereby affecting the shear strength. Here, a small effect of improving the bonding reliability is resulted when the electrically-conductive metal(s) are contained by less than 1 mol %. Meanwhile, the shear strength tends to decrease when the electrically-conductive metal(s) are contained by more than 3 mol %, thereby resulting in narrow ranges of bonding conditions for controlling the decrease in shear strength, thus raising a concern of causing a mass productivity to decrease. When the concentration of the aforementioned electrically-conductive metal(s) in total is 0.3-2 mol %, there can be achieved not only the effect of improving the bonding reliability, but also an effect of controlling metal lift failures if appropriately adjusting the bonding conditions such as load, ultrasonic vibration or the like at the time of performing ball bonding. Since the recent LSI electrode structure employs a low-k film, metal lift failures, i.e., peeling of an electrode film at the time of bonding have become a problem. The metal lift failures are more critical than the aforementioned chip damages. While a concentration of lower than 0.3 mol % brings about a small effect of improving the bonding reliability, a concentration of higher than 2 mol % raises the concern of possible metal lift failures.

With regard to the aforementioned single-layered copper bonding wire, wire-material factors mainly affecting R1 include, for example: the concentration of Pd, Au and Ag serving as electrically-conductive metals; a uniformity of the corresponding concentration; a grain diameter distribution of copper; the processing strain; the thickness and distribution of the surface Cu oxide film; and a minute concentration of gas components in Cu. Here, R1 can be effectively increased by, for example: increasing the concentration of Pd, Au and Ag serving as electrically-conductive metals; reducing as well as uniformly distributing the thickness of the surface Cu oxide film; and equalizing the processing strain inside the wire. It is easier to obtain R1 of the range of the present invention of 50-100%, by appropriately combining the aforementioned material factors with one another. Preferably, R2 can effectively fall within the range of the present invention of 50-100%, as a result of increasing and uniformly distributing the concentration of Pd, or reducing the thickness of the surface Cu oxide film.

Wire-material factors affecting R3 are substantially identical to those affecting R1. Preferably, R3 can effectively fall within the range of the present invention of not lower than 0% but lower than 40%, as a result of reducing gas components in Cu, including S, N, O, H or the like. Preferably, controlling the hydrogen gas components allows R4 to be effectively and stably controlled to the range of not lower than 0% but lower than 40%.

With regard to the aforementioned multilayer copper bonding wire and the single-layered copper bonding wire, it is desired that the copper bonding wire contain at least one of P, Si, B and Ge by 0.0001-0.03 mol %. Such copper bonding wire enables a super low loop with a loop height of not higher than 60 μm. The neck portion is subjected to the thermal effect at the time of forming the ball, thereby causing the recrystallized grains to grow and thus raising a problem of causing cracks in the neck portion when forming low loops. The copper bonding wire containing the element group of P, Si, B and Ge, brings about a high effect of reducing neck damages by controlling the growths of the recrystallized grains. Here, a small improvement effect is resulted when the aforementioned concentration is lower than 0.0001 mol %. Meanwhile, a concentration of higher than 0.03 mol % causes the wire to be hardened, thereby resulting in unstable loop heights, thus being unsuitable for forming low loops. Preferably, when a total concentration of P, Si, B and Ge is 0.0005-0.02 mol %, there can be improved an effect of improving a low-loop forming capability of the thin wire with the wire diameter of not larger than 18 μm.

Working Examples

Working examples are described hereunder.
Raw materials of a copper bonding wire were as follows. As a core material, there was used Cu with a purity of not less than about 99.99% by mass, such Cu being an ultrapure material. Further, as an outer layer material, there was used Pd, Au or Ag with a purity of not less than 99.95% by mass, such Pd, Au or Ag being a highly pure material.

As for a monolayer copper bonding wire, there was manufactured an ingot by melting the ultrapure Cu to which a given alloy element(s) had been added. Here, a melting temperature was set to be 1100-1300° C. Further, rates at which the temperature rose and fell were controlled. Furthermore, as for an atmosphere, there were repeatedly performed vacuumization, inert gas replacement and the like. In this way, there could be controlled concentrations, distributions and the like of gas components in Cu.

When manufacturing a multilayer copper bonding wire, a copper wire having a wire diameter of about 50-2000 μm was prepared as a core member in advance, followed by coating a surface of such copper wire with the outer layer through electrolytic plating, electroless plating, an evaporation method or the like. Here, there were controlled a smoothness, an oxide film and the like on the surface of the uncoated core member. Other than a selection of a plating solution, strict controls were also carried out over, for example: impurities mixed into a plating bath; stirring of the plating solution; and stabilizations of a concentration and a temperature of the plating solution while performing plating. A diffusion heat treatment for improving an adhesion was carried out immediately after performing plating.

The copper wire thus coated with the outer layer was then drawn to a final diameter of 17 μm, followed by performing a heat treatment thereon so as to remove a processing strain and cause an elongation value to be within a range of 5-15%. If necessary, the coated copper wire was drawn to a diameter of 25-200 μm through wire drawing dies, followed by performing an intermediate heat treatment thereon and then further drawing the same. Here, a reduction of area of each one of the wire drawing dies was 5-15%. An introduction of the processing strain on a wire surface, for example, was controlled by a combination of the corresponding dies. A drawing rate was appropriately adjusted within a range of 20-500 m/min. By appropriately combining, for example: the rate, a tensile force, a lubricity and a die shape that were employed for drawing; and a temperature, a wire diameter and a gas atmosphere that were employed for the intermediate heat treatment, there were controlled, for example: a uniformity in a film thickness of the outer layer; the adhesion and a uniformity between the outer layer and the core member; and a concentration and distribution of a gas component such as hydrogen or the like.

Each heat treatment performed on the wire of the present invention was carried out by heating the wire while continuously drawing the same. There were employed a method of locally introducing a temperature gradient and a method of changing the temperature inside a furnace. By controlling, for example: a temperature distribution; a heating time; and a rate and a tensile force that were employed for the wire drawing, there were controlled, for example: a formation of a diffusion layer between the outer layer and the core member; the adhesion between the outer layer and the core member; and an oxide film on the wire surface. As for the atmosphere of the heat treatment, an inert gas such as $N_2$, Ar or the like was also partially used for the purpose of controlling an oxidation, and an oxygen concentration inside the furnace was controlled also. Here, a gas flow rate was adjusted within a range of 0.0002-0.004 $m^3$/min, and was thus used to control the temperature inside the furnace. Further, a cooling rate was also controlled through a stepwise temperature adjustment at an outlet of the furnace for heat treatment, spraying of a cold gas and an application of a coolant. As for a timing for performing the heat treatment, there was selectively employed a method in which a surface skin layer was formed after performing the heat treatment on the drawn wire, or a method in which the heat treatment was performed in at least one of the occasions including before processing the wire, while processing the wire and immediately after forming the surface skin layer.

The copper bonding wire of the present invention improves a bonding reliability and can be manufactured by complexly controlling various process factors including, for example, the aforementioned conditions for film formation and the conditions under which processing and the heat treatment are carried out. Therefore, it is effective to control various material variables including materials, compositions, thicknesses and the like. As for the monolayer copper bonding wire, it is similarly effective to control, for example, an alloy concentration and an elongation. In the working examples, representative material variables were, for example: a structure, an element(s) and a composition of the outer layer; the film thicknesses of the outer layer and the diffusion layer; the element(s) of the core member; and a tensile elongation. Further, the process factors partially included, for example: the number of heat treatment cycles; and a heat treatment temperature and a drawing rate that allowed the final wire diameter to be reached.

A film thickness measurement on the surface of the multilayer copper bonding wire, was carried out by performing a surface analysis and a depth analysis through AES. An electrically-conductive metal concentration in the wire was measured through, for example, an inductively coupled plasma analysis (ICP).

A commercially available automatic wire bonder (Eagle 60-AP by ASM) was used to bond the copper bonding wire through ball/wedge bonding. A ball portion was formed on one end of the wire through an arc discharge, followed by bonding the ball portion thus formed to an electrode film on a silicon substrate and wedge bonding the other end of the wire to a lead terminal. A mixed gas of $N_2$-5% $H_2$ was sprayed on the one end of the wire so as to control an oxidation at the time of melting the ball. As for an initial ball size, there were prepared for evaluation a ball of a normal size of about 30 μm and a small ball of about 26 μm. As for a bonding temperature, there were used a normal temperature of 175° C. and a low temperature of 150° C.

An aluminum electrode (Al-1% Si-0.5% Cu film, Al-0.5% Cu film) was employed as an electrode provided on the silicon substrate and serving as a bonding target. As for a thickness of such electrode, there were employed three kinds of thicknesses including a thickness of 0.4 μm, a thickness of 1 μm and a thickness of 2 μm. Meanwhile, as a target of wedge bonding, there was used an Ag-plated electrode on a lead frame. Here, in terms of a combination of the initial ball size and the aluminum electrode thickness, there were prepared: a bonding sample employing the initial ball size of about 30 μm and the aluminum electrode thickness of 0.6 μm, 1 μm or 2 μm; and a bonding sample employing the initial ball size of about 26 μm and the aluminum electrode thickness of 1 μm.

A ball-bonded portion of the copper bonding wire and the aluminum electrode was then heated at a high temperature (HTS evaluation), or heated at a high temperature and at a high humidity (UHAST evaluation), followed by cross-sectioning such ball-bonded portion so as to study, for example, intermetallic compounds, a concentrated layer and a Cu alloy layer.

The high-temperature heating was carried out at 150-200° C. for 200-700 hours if using a sample that was not sealed with a resin, but at 150-175° C. for 200-800 hours if using a resin-sealed sample. The high-humidity/temperature heating was performed on the resin-sealed sample, at 130-170° C. and 85-100% RH for 400 hours. Here, as for conditions of high-humidity/temperature heating in Table 1, only working example 10 (150° C.-85% RH), working example 11 (170° C.-100% RH) and working example 23 (170° C.-85% RH) were subjected to special heating conditions, whereas other working examples and comparative examples were subjected to a UHAST evaluation condition of 130° C.-85% RH and had results thereof shown in Table 1.

Devices including AES, EPMA, EDX, TEM and the like were used to analyze the ball-bonded portion. Identifications of phases of the intermetallic compounds or the like formed in an interface, were carried out mainly through, for example, an electron diffraction of TEM and a quantitative analysis performed by AES. The concentrated layer, the Cu alloy layer and the like were confirmed mainly through quantitative analyses performed by AES, EPMA or EDX. Further, thicknesses of products in the interface were evaluated mainly through line analyses performed by AES, EPMA or EDX, or through photographs taken by, for example, SEM, TEM and an optical microscope. In fact, semiconductors are, for example, manufactured and used differently in terms of varieties in processes, histories or the like after completing ball bonding. For this reason, there were analyzed several samples obtained through different processes and having different heat histories. There were used, for example: a sample obtained immediately after completing ball bonding; and a sample obtained after performing resin sealing and cure heating. Evaluation results thereof are shown in Table 1. Here, evaluation methods in Table 1 are as follows. That is, in Table 1, "A" indicates that the sample used had been heated at a high temperature, whereas "B" indicates that the sample used had been heated at a high temperature and at a high humidity.

A bonding reliability in a high-temperature environment was evaluated as follows. That is, a resin-sealed sample obtained after completing bonding, was heated before removing the resin. After the resin had been removed, there were evaluated shear strengths of 20 ball-bonded portions. Here, a commercially available mold opener (by NSC) was used to remove the resin. The sample was heated at: 150° C. for 1000, 2000, 3000, 4000 or 4500 hours; 175° C. for 2000 hours; or 200° C. for 1000 hours. Hypothetically, the heating temperatures of 150° C., 175° C. and 200° C. were respectively intended for an evaluation of a general-purpose LSI, a strict evaluation of a vehicle-mounted LSI and a stricter evaluation of a vehicle-mounted LSI of the next generation. The bonding reliability was then evaluated based on a relative value (shear strength ratio) of a shear strength of each heated sample to an average shear strength measured before heating each sample. Evaluation results thereof are listed under a column titled "High-temperature reliability" in Table 3. Here, crosses represent a poor condition in which three or more ball-bonded portions exhibited a shear strength ratio of less than 20%. Circles represent a relatively favorable condition in which all the ball-bonded portions exhibited a shear strength ratio of not less than 50%. Double circles represent a condition in which all the ball-bonded portions exhibited a significantly favorable reliability, i.e., a shear strength ratio of not less than 80%. Triangles represent a condition that does not fall under any one of the three evaluations mentioned above. In fact, the triangles represent a condition that required an improvement, but was problem-free in terms of practical use.

A bonding reliability in a high-humidity/temperature environment, was evaluated basically in the same manner as the aforementioned evaluation of the bonding reliability in the high-temperature environment, the only difference being the heating conditions. A resin-sealed sample obtained after completing bonding was subjected to heat treatments through a HAST and a UHAST, before removing the resin. After the resin had been removed, there were evaluated shear strengths of 20 ball-bonded portions. The heating conditions are as follows. That is, the HAST employed a heating condition of 130° C., 85% RH while allowing a bias to be applied to the sample. Meanwhile, the UHAST employed a heating condition of 130° C., 85% RH without allowing the bias to be applied to the sample. As for a heating time, the HAST employed heating times of 96 h, 144 h, 192 h, 288 h, 336 h and 408 h, while the UHAST employed heating times of 300 h, 500 h and 700 h. The bonding reliability was then evaluated based on a relative value (shear strength ratio) of a shear strength of each heated sample to the average shear strength measured before heating each sample. Evaluation results thereof are listed under a column titled "High-humidity/temperature reliability" in Table 3. Here, crosses represent a poor condition in which three or more ball-bonded portions exhibited the shear strength ratio of less than 20%. Circles represent a relatively favorable condition in which all the ball-bonded portions exhibited the shear strength ratio of not less than 50%. Double circles represent a condition in which all the ball-bonded portions exhibited the significantly favorable reliability, i.e., the shear strength ratio of not less than 80%. Triangles represent a condition that does not fall under any one of the three evaluations mentioned above. In fact, the triangles represent a condition that required an improvement, but was problem-free in terms of practical use.

A shape of the ball-bonded portion was evaluated as follows. That is, there were observed 200 ball-bonded balls. Particularly, the ball-bonded balls were evaluated in terms of, for example, roundness in shape, excessive deformation failure and dimension accuracy. Evaluation results thereof are listed under a column titled "Ball-bonded shape" in Table 3. Here, crosses represent a poor condition in which six or more ball-bonded balls exhibited a defective ball shape such as a petal shape, an anisotropic shape deviated from a shape of a true circle, or the like. Further, there were given two types of evaluations including "triangle" and "circle," when one to five ball-bonded balls exhibited the defective ball shape such as the anisotropic shape, the petal shape or the like. Specifically, the triangles represent a condition in which one or more ball-bonded balls exhibited an excessive deformation failure such as a noticeable core deviation or the like. Such condition is preferably improved in terms of mass productivity. Further, the circles represent a condition in which no excessive deformation failure was observed. Here, double circles represent a condition in which none of the ball-bonded balls exhibited a defective ball shape.

Shear strengths were evaluated as follows. That is, a shear test was performed on 30 ball-bonded portions, followed by measuring an average value of the shear strengths thus obtained. In fact, there was evaluated a shear strength per unit area that could be calculated using an average value of areas of the ball-bonded portions. Evaluation results thereof are listed under a column titled "Shear strength" in Table 3. Here, crosses represent an insufficient bonding strength in which the shear strength per unit area was smaller than 70 MPa. Triangles represent a condition in which the shear strength per unit area was not smaller than 70 MPa but smaller than 90 MPa, i.e., a condition improvable through a number of modifications in bonding conditions. Circles represent a condition in which the shear strength per unit area was not smaller than 90 Mpa but smaller than 110 MPa, i.e., a problem-free condition in terms of practical use. Double circles represent a favorable condition in which the shear strength per unit area was not smaller than 110 MPa.

Chip damages were evaluated as follows. That is, after the ball portion had been bonded to the electrode film, an etching method was used to remove the corresponding electrode film, followed by observing damages on an insulation film or a silicon chip through SEM. Particularly, there were observed 400 electrodes. Evaluation results thereof are listed under a column titled "Chip damage" in Table 3. Here, double circles represent a condition in which no damage was observed. Circles represent a problem-free condition in which there were observed not more than two cracks of a size of not larger than 5 μm. Triangles represent a condition of concern in which there were observed two or more cracks of the size of not larger than 5 μm, and not more than one crack of a size of 10 μm or larger. Crosses represent a further problematic condition in which there were observed two or more cracks of the size of 10 μm or larger.

A metal lift evaluation was carried out as follows. That is, after the ball portion had been bonded to an electrode film made of an aluminum alloy, a pull test was performed on the wire so as to evaluate how peeling occurred from the electrode film underneath the ball-bonded portion. As for failure acceleration, a high load and a high ultrasonic power were used to perform ball bonding. Particularly, the pull test was performed with a hook being used in a section of the wire that was away from the ball-bonded portion by about one third a span. In fact, the test was performed on 100 ball-bonded portions, and there was measured the number of metal lift failures observed. Evaluation results thereof are listed under a column titled "Metal lift" in Table 3. Here, crosses represent a condition in which seven or more wires exhibited the metal lift failures. Triangles represent a condition in which 3-6 wires exhibited the metal lift failures, i.e., a condition that required an improvement. Circles represent a substantially favorable condition in which one or two wires exhibited the metal lift failures. Double circles represent a favorable condition in which no metal lift failure was observed, i.e., a condition free from concerns of metal lift failures.

As for a wedge bonding evaluation, there were evaluated 1000 wires. Evaluation results thereof are listed under a column titled "Wedge bonding" in Table 3. Here, crosses represent a condition in which a continuous bonding operation was halted twice or more due to failures in a wedge-bonded portion. That is, the crosses represent unfavorable wedge bondabilities. Triangles represent a condition in which the continuous bonding operation was halted not more than once, and a type of failure such as peeling or the like was observed in five or more wires through an optical microscopic observation. That is, the triangles represent insufficient wedge bondabilities. Circles represent a condition in which peeling was observed in one wire, even though the continuous bonding operation was possible. That is, the circles represent a condition improvable through modifications in bonding conditions. Double circles represent a condition in which no failure occurred during the continuous bonding operation. That is, the double circles represent favorable wedge bondabilities.

A loop control evaluation was carried out by evaluating a linearity of the wire with a long span of 5 mm. Particularly, 50 loops were observed from above by a projector. Here, a bending amount was measured. This bending amount refers to an amount at which each copper bonding wire was most deviated from a straight line connecting the ball-bonded portion with the wedge-bonded portion. Evaluations thereof are listed under a column titled "Loop control" in Table 3. Here, double circles represent a favorable condition in which an average bending amount was smaller than the wire diameter of one wire. Triangles represent a defective condition in which the average bending amount was equivalent to the wire diameters of two wires or larger. Circles represent a condition in which the average bending amount fell somewhere in between those rated as "Double circle" and those rated as "Triangle." That is, the circles represent a condition that is problem-free in a normal setting.

A low loop property evaluation was carried out as follows. That is, there were connected 50 super low loops having a wire length of 2 mm and a loop height of about 60 μm. Further, there were evaluated degrees of damages on neck portions. Levels of the damages were divided into three categories including "severe damage," "small damage" and "no damage." Here, "severe damage" refers to a large crack opening observed on each neck portion, and "small damage" refers to a small crack opening observed thereon. Evaluation results thereof are listed under a column titled "Low loop" in Table 3. Here, crosses represent a defective condition in which two or more loops exhibited the severe damages. Triangles represent a condition in which not more than one loop exhibited the severe damage, whereas five or more loops exhibited the small damages. That is, the triangles represent a condition requiring improvements in loop conditions. Triangles represent a problem-free condition in terms of practical use, in which no severe damage was observed and the small damages were observed in less than five loops.

As for a leaning failure (leaning property) known as a phenomenon in which a wire upright section in the vicinity of the ball-bonded portion leans, the wire upright section was observed from a chip horizontal direction so as to evaluate a maximum distance (leaning distance) between a perpendicular line passing through a center of the ball-bonded portion and the wire upright section. Here, there were observed 50 wires having a wire length of 3 mm. Particularly, the wires prepared had a maximum loop height of about 400 μm, which enabled a strict leaning evaluation. The leaning property was determined as favorable if the aforementioned leaning distance was smaller than the wire diameter. Meanwhile, the leaning property was determined as unfavorable if the leaning distance was larger than the wire diameter, i.e., the wire upright section was leaning. The leaning failure was evaluated in terms of an occurrence frequency thereof. Evaluation results thereof are listed under a column titled "Leaning property" in Table 3. Here, triangles represent a condition in which the leaning failure was observed in three or more wires. Double circles represent a condition in which no leaning failure was observed. Circles indicate that the number of the wires exhibiting the leaning failure fell somewhere in between those rated as "Triangle" and those rated as "Double circle."

In Table 1, a bonding structure according to claim 1 is equivalent to each one of working examples 1 through 28. A bonding structure according to claim 2 is equivalent to each one of working examples 3 through 12, 14 through 24, and 26 through 28. A bonding structure according to claim 3 is equivalent to each one of working examples 4 through 12, 14 through 25, 27 and 28. A bonding structure according to claim 4 is equivalent to each one of working examples 2 through 24, and 26 through 28. A bonding structure according to claim 5 is equivalent to each one of working examples 2 through 12, 15 through 24, 27 and 28. A bonding structure according to claim 6 is equivalent to each one of working examples 3 through 11, 15 through 24, and 26 through 28. A copper bonding wire according to claim 7 is equivalent to each one of working examples 1 through 28. A copper bonding wire according to claim 8 is equivalent to each one of working examples 1 through 24. A copper bonding wire according to claim 9 is equivalent to each one of working examples 6, 8, 9, 12, 19, 21, 22 and 24. A copper bonding wire according to claim 10 is equivalent to each one of working examples 1 through 23. A copper bonding wire according to claim 11 is equivalent to each one of working examples 1 through 10, 12 through 23, and 26 through 28. A copper bonding wire according to claim 12 is equivalent to each one of working examples 2 through 5, 8, 12, 16, 17, 20 and 24. Further, comparative examples 1 through 6 are equivalent to copper bonding wires not satisfying claim 1.

Bonding structures of working examples 1 through 28 are relevant to claim 1 of the present invention. According to these bonding structures, since a relative compound ratio R1 of CuAl phase formed in the ball-bonded portion that had been heated at a temperature of 130-200° C. was not lower than 50%, a favorable bonding reliability was confirmed after being heated at 150° C. for 3000 hours. Meanwhile, since the aforementioned ratio R1 was less than 50% in comparative examples 1 through 6, a low bonding reliability was confirmed when heated at the high temperature of 150° C. The ratio R1 was preferably higher than 70% in working examples 4 through 12, 14 through 24, 27 and 28. As for these working examples, an improved bonding reliability could be obtained under a strict high-temperature heating condition of 150° C.-3500 h.

Bonding structures of working examples 3 through 12, 14 through 24, and 26 through 28 are relevant to claim 2 of the present invention. According to these bonding structures, since a relative compound ratio R2 of the CuAl phase formed in the ball-bonded portion that had been heated at a relative humidity of 85-100% was not lower than 50%, a favorable bonding reliability was confirmed after being heated for 192 hours in the HAST serving as a high-humidity/temperature heating test, or for 300 hours in the UHAST (130° C.-85% RH, no bias). The aforementioned ratio R2 was preferably higher than 70% in working examples 5 through 12, 15 through 24, 27 and 28. As for these working examples, an improved bonding reliability could be obtained when heated under a strict heating condition such as 336 hours in the HAST or 500 hours in the UHAST.

Bonding structures of working examples 4 through 12, 14 through 25, 27 and 28 are relevant to claim 3 of the present invention. According to these bonding structures, since a ratio R3 of a total thickness of a $Cu_9Al_4$ phase and a $CuAl_2$ phase that were formed on the ball-bonded portion heated at a temperature of 130-200° C. was less than 40%, a favorable bonding reliability was confirmed after being heated at 150° C. for 4000 hours. The aforementioned ratio R3 was preferably less than 15% in working examples 5 through 12, 15 through 24, and 28. As for these working examples, an improved bonding reliability could be obtained when heated under a strict condition of 150° C. for 4500 hours.

Bonding structures of working examples 4 through 12, 15 through 24, 27 and 28 are relevant to claim 3 of the present invention. According to these bonding structures, since a ratio R4 of a total thickness of the $Cu_9Al_4$ phase and the $CuAl_2$ phase that were formed on the ball-bonded portion heated at a high temperature and a high relative humidity of 85-100% was less than 40%, a favorable bonding reliability was confirmed after being heated for 288 hours in the HAST. The aforementioned ratio R4 was preferably less than 15% in working examples 5 through 12, 17 through 24, and 28. As for these working examples, an improved bonding reliability could be obtained when heated under a strict condition of 408 hours in the HAST.

Bonding structures of working examples 2 through 24, and 26 through 28 are relevant to claim 4 of the present invention. According to these bonding structures, there was formed a concentrated layer highly containing at least one of Pd, Au and Ag serving as electrically-conductive metals, thereby allowing a favorable bonding reliability to be confirmed even when heated at 175° C. for 2000 hours. Preferably, as for such concentrated layer, a maximum concentration of the aforementioned electrically-conductive metals in total was not lower than 0.1 mol %, and a thickness of the corresponding concentrated layer was not smaller than 0.1 µm in working examples 3 through 12, 15 through 24, and 26 through 28. As for these working examples, a further improved bonding reliability was confirmed when heated at 175° C. for 2000 hours.

Bonding structures of working examples 2 through 12, 15 through 24, 27 and 28 are relevant to claim 5 of the present invention. According to these bonding structures, there was formed in the ball-bonded portion intermetallic compounds composed of Cu, Al and at least one of the aforementioned electrically-conductive metals, thereby allowing a favorable bonding reliability to be confirmed even when heated for 408 hours in the HAST. Preferably, the maximum concentration of the aforementioned electrically-conductive metals in total was not lower than 0.5 mol %, and a thickness of the intermetallic compounds was not smaller than 0.02 µm in working examples 4 through 12, 16 through 24, and 28. As for these working examples, an improved reliability was confirmed in the HAST performed under the aforementioned condition. More preferably, the thickness of the aforementioned intermetallic compounds was within a range of 0.05-2 µm in working examples 5 through 9, 12, 17 through 22, 24 and 28. As for these working examples, a high reliability was confirmed in the HAST targeted at a ball-bonded portion with a thin aluminum electrode film of 0.6 µm.

Bonding structures of working examples 3 through 11, 15 through 24, and 26 through 28 are relevant to claim 6 of the present invention. According to these bonding structures, there was foamed in the ball-bonded portion a Cu alloy layer containing the aforementioned electrically-conductive metals in a total concentration of up to 0.5-30 mol %, thereby allowing a favorable bonding reliability to be confirmed when heated at 200° C. for 1000 hours in an HTS test. This condition is equivalent to a significantly strict standard intended for a vehicle-mounted LSI disposed on a periphery of an engine. Preferably, a thickness of the Cu alloy layer was not smaller than 0.1 µm in working examples 3 through 11, 15 through 24, and 26 through 28. As for these working examples, an improved reliability was confirmed in the HTS test performed under the aforementioned condition. More preferably, the thickness of the Cu alloy layer was not smaller than 1 µm in working examples 6 through 11, 15 through 24, and 28. As for these working examples, an improved bonding reliability could be obtained in the HTS test when employing a thick aluminum electrode film of 2 µm.

Copper bonding wires of working examples 1 through 24 are relevant to claim 8 of the present invention. According to these copper bonding wires, the ratio R1 of the thickness of the CuAl phase was not lower than 50%. Further, each one of the corresponding copper bonding wires was a multilayer copper bonding wire including: the core member mainly composed of copper; and the outer layer formed on such core member and mainly composed of at least one of Pd, Au and Ag serving as electrically-conductive metals. Therefore, it was confirmed that the shape of the ball-bonded portion was close to that of a true circle as a result of a restriction on irregular deformation. Preferably, the outer layer contained Pd in working examples 1, 2, 5 through 12, 14, and 16 through 24. As for these working examples, it was confirmed that the shape of the ball-bonded portion was even closer to that of the true circle.

Copper bonding wires of working examples 6, 8, 9, 12, 17, 19, 21, 22 and 24 are relevant to claim 9 of the present invention. Each one of these copper bonding wires was a multilayer copper bonding wire whose outer layer was formed of: a single metal outer layer composed of any one of Pd, Au and Ag serving as electrically-conductive metals; and an alloy outer layer mainly composed of at least two of the corresponding electrically-conductive metals. Therefore, an improved leaning property was confirmed in these working examples. Preferably, the single metal outer layer was composed of Pd, and the alloy outer layer was composed of an alloy of Pd and Au or an alloy of Pd and Ag in working examples 6, 8, 9, 12, 19, 21 and 24. As for these working examples, there was confirmed a higher effect of controlling the leaning property.

Copper bonding wires of working examples 1 through 23 are relevant to claim 10 of the present invention. Each one of these copper bonding wires was a multilayer copper bonding wire whose outer layer had a thickness of 0.01-0.4 µm, thereby allowing a favorable wedge bondability to be confirmed. Preferably, the thickness of the outer layer was 0.02-0.3 µm in working examples 2 through 9, 12 through 23. As for these working examples, a further improved wedge bondability was confirmed.

Copper bonding wires of working examples 1 through 10, 12 through 23, and 26 through 28 are relevant to claim 11 of the present invention. Each one of these copper bonding wires contained at least one of Pd, Au and Ag serving as electrically-conductive metals in a concentration of 0.1-3 mol %, thereby allowing an improved shear strength of the ball-bonded portion to be confirmed. Here, the copper bonding wires of working examples 26 through 28 were monolayer copper bonding wires. Preferably, the aforementioned concentration was 0.3-2 mol % in working examples 2 through 9, 12 through 22, and 26 through 28. In these working examples, it was confirmed that the metal lift failures were controlled.

Copper bonding wires of working examples 2 through 5, 8, 12, 15 through 17, and 24 are relevant to claim 12 of the present invention. Each one of these copper bonding wires contained at least one of P, Si, B and Ge in a concentration of 0.0001-0.03 mol %, thereby allowing a favorable low loop property to be confirmed. Preferably, the aforementioned concentration was 0.0005-0.02 mol % in working examples 3 through 5, 8, 12, 16, 17 and 20. A further improved wedge bondability was confirmed in these working examples.

TABLE 1

| | | Relative ratio of intermetallic compound | | | | Concentrated layer | | | Ternary intermetallic compound | | | Cu alloy layer | | |
| | | High-temperature heating (A) | | High-temperature/ humidity heating (B) | | | Highest | | | Highest | | | Highest | | |
| | | CuAl R1 (%) | Cu₉Al₄, CuAl₂ R3 (%) | CuAl R2 (%) | Cu₉Al₄, CuAl₂ R4 (%) | Main component | concentration mol % | Thickness μm | Evaluation method | concentration mol % | Thickness μm | Evaluation method | concentration mol % | Thickness μm | Evaluation method |
|---|---|---|---|---|---|---|---|---|---|---|---|---|---|---|---|
| Working examples | 1 | 50 | 43 | 45 | 50 | Pd | 0 | 0 | A | 0 | 0 | A | 0 | 0 | A |
| | 2 | 62 | 47 | 46 | 43 | Pd | 0.08 | 0.1 | A | 0.4 | 0.01 | A | 0.3 | 0.03 | A |
| | 3 | 56 | 42 | 50 | 41 | Au | 0.5 | 0.15 | A | 0.5 | 0.01 | A | 0.5 | 0.08 | A |
| | 4 | 70 | 28 | 60 | 39 | Ag | 1 | 0.4 | B | 1 | 0.04 | B | 1 | 0.3 | B |
| | 5 | 80 | 14 | 75 | 14 | Pd | 3 | 0.5 | B | 1.5 | 0.05 | B | 3 | 0.4 | B |
| | 6 | 90 | 10 | 90 | 10 | Pd, Ag | 2 | 1.2 | A | 2 | 0.1 | A | 1 | 1 | A |
| | 7 | 100 | 5 | 100 | 0 | Pd | 3 | 4 | A | 2.5 | 0.2 | A | 2 | 3 | A |
| | 8 | 100 | 0 | 100 | 0 | Pd | 6 | 6 | A | 3 | 0.6 | A | 6 | 5 | A |
| | 9 | 100 | 0 | 100 | 0 | Pd, Au | 8 | 10 | A | 2 | 1.8 | A | 8 | 8 | A |
| | 10 | 100 | 0 | 100 | 0 | Pd | 15 | 12 | B | 2 | 2.5 | A | 15 | 4 | A |
| | 11 | 100 | 0 | 100 | 0 | Pd | 20 | 16 | B | 8 | 4 | A | 20 | 6 | A |
| | 12 | 100 | 0 | 100 | 0 | Pd, Au | 32 | 6 | A | 16 | 1 | A | 32 | 3 | A |
| | 13 | 55 | 42 | 48 | 46 | Au | 0.05 | 0.05 | B | 0 | 0 | B | 0 | 0 | B |
| | 14 | 70 | 30 | 55 | 41 | Pd | 0.2 | 0.07 | A | 0 | 0 | A | 0.2 | 0.1 | A |
| | 15 | 90 | 10 | 75 | 25 | Ag | 0.2 | 1.1 | A | 0.2 | 0.02 | A | 1 | 1 | A |
| | 16 | 100 | 5 | 85 | 15 | Pd | 5 | 2 | B | 0.5 | 0.02 | B | 5 | 1.5 | B |
| | 17 | 90 | 0 | 95 | 5 | Pd, Ag | 4 | 6 | B | 1 | 0.05 | B | 4 | 5 | B |
| | 18 | 100 | 0 | 100 | 0 | Pd | 8 | 3.5 | A | 2 | 0.2 | A | 8 | 3 | A |
| | 19 | 100 | 0 | 100 | 0 | Pd, Au | 25 | 4.5 | A | 1 | 0.4 | A | 25 | 4 | A |
| | 20 | 100 | 0 | 100 | 0 | Pd | 5 | 9 | A | 2.5 | 1 | A | 5 | 8 | A |
| | 21 | 100 | 0 | 100 | 0 | Pd | 18 | 6 | A | 3 | 2 | A | 18 | 3 | A |
| | 22 | 100 | 0 | 100 | 0 | Pd, Au, Ag | 5 | 6 | A | 5 | 1.5 | A | 3 | 5 | A |
| | 23 | 100 | 0 | 100 | 0 | Pd | 6 | 15 | B | 6 | 2.9 | A | 5 | 12 | A |
| | 24 | 100 | 0 | 100 | 0 | Pd, Ag | 15 | 5 | A | 15 | 0.7 | A | 7 | 4 | A |
| | 25 | 60 | 39 | 48 | 45 | Pt | 0.5 | 0.5 | A | 0 | 0 | A | 0.4 | 0.5 | A |
| | 26 | 50 | 45 | 50 | 42 | Ag | 1 | 0.6 | A | 0 | 0 | A | 1 | 0.3 | A |
| | 27 | 70 | 25 | 80 | 15 | Pd | 2 | 0.3 | B | 0.5 | 0.03 | B | 1 | 0.2 | B |
| | 28 | 95 | 5 | 90 | 5 | Pd | 5 | 2.7 | A | 2 | 0.5 | A | 5 | 2 | A |
| Comparative examples | 1 | 0 | 100 | 0 | 100 | — | 0 | 0 | A | 0 | 0 | A | 0 | 0 | A |
| | 2 | 45 | 55 | 40 | 50 | Pd, Ag | 1.0 | 1.5 | A | 0.7 | 0.2 | A | 1 | 1 | A |
| | 3 | 0 | 70 | 0 | 100 | Pd | 0 | 0 | B | 0 | 0 | B | 0 | 0 | B |
| | 4 | 12 | 80 | 20 | 80 | Pd | 2 | 2 | A | 0 | 0 | A | 2 | 2 | A |
| | 5 | 40 | 40 | 55 | 40 | Ag | 3 | 1.2 | B | 0.5 | 0.02 | B | 3 | 1 | B |
| | 6 | 25 | 70 | 10 | 80 | Pd | 0 | 0 | A | 0.1 | 0.02 | A | 0.3 | 0.03 | A |

TABLE 2

| | | | Outer layer | | | | | Element concentration in wire mol % | | | | | |
| | | Main component | Surface side (Alloy outer layer) | Inner side (Single outer layer) | Film thickness/ μm | Thickness of diffusion layer/ μm | Core member Added element | Remainder | Pd, Ag, Au | P | Si | B | Ge | Cu |
|---|---|---|---|---|---|---|---|---|---|---|---|---|---|---|
| Working examples | 1 | Pd | — | — | 0.01 | 0.0006 | — | Cu | 0.2 | | | | | Remainder |
| | 2 | Pd | — | — | 0.02 | 0.002 | — | Cu | 0.3 | 0.0001 | | | | Remainder |
| | 3 | Au | — | — | 0.03 | 0.005 | — | Cu | 0.4 | | 0.006 | | | Remainder |
| | 4 | Ag | — | — | 0.04 | 0.012 | — | Cu | 0.6 | | | 0.001 | | Remainder |
| | 5 | Pd | — | — | 0.05 | 0.007 | — | Cu | 0.7 | 0.002 | | | | Remainder |
| | 6 | Pd, Ag | PdAg alloy | Pd | 0.06 | 0.003 | — | Cu | 0.8 | | | | | Remainder |
| | 7 | Pd | — | — | 0.08 | 0.01 | — | Cu | 1 | | | | | Remainder |
| | 8 | Pd, Au | PdAu alloy | Pd | 0.12 | 0.02 | — | Cu | 1.3 | | | 0.005 | | Remainder |
| | 9 | Pd, Au | PdAu alloy | Pd | 0.2 | 0.04 | — | Cu | 1.7 | | | | | Remainder |
| | 10 | Pd | — | — | 0.35 | 0.08 | — | Cu | 3 | | | | | Remainder |
| | 11 | Pd | — | — | 0.4 | 0.22 | — | Cu | 3.1 | | | | | Remainder |
| | 12 | Pd, Au | PdAu alloy | Pd | 0.27 | 0.15 | — | Cu | 2 | 0.003 | | | | Remainder |
| | 13 | Au | — | — | 0.02 | 0.001 | — | Cu | 0.3 | | 0.00007 | | | Remainder |
| | 14 | Pd | — | — | 0.04 | 0.006 | — | Cu | 0.6 | | | | | Remainder |
| | 15 | Ag | — | — | 0.06 | 0.008 | — | Cu | 0.9 | | | | 0.035 | Remainder |
| | 16 | Pd | — | — | 0.09 | 0.016 | — | Cu | 1.1 | 0.007 | | | | Remainder |
| | 17 | Pd, Ag | Ag | Pd | 0.12 | 0.003 | — | Cu | 1.3 | | | 0.0005 | | Remainder |

TABLE 2-continued

| | | Outer layer | | | | Core member | | Element concentration in wire mol % | | | | | |
|---|---|---|---|---|---|---|---|---|---|---|---|---|---|
| | Main component | Surface side (Alloy outer layer) | Inner side (Single outer layer) | Film thickness/μm | Thickness of diffusion layer/μm | Added element | Remainder | Pd, Ag, Au | P | Si | B | Ge | Cu |
| 18 | Pd | — | — | 0.07 | 0.009 | — | Cu | 0.9 | | | | | Remainder |
| 19 | Pd, Ag | PdAg alloy | Pd | 0.1 | 0.006 | — | Cu | 1 | | | | | Remainder |
| 20 | Pd | — | — | 0.18 | 0.03 | — | Cu | 1.5 | | | 0.002 | | Remainder |
| 21 | Pd, Ag | PdAg alloy | Pd | 0.14 | 0.01 | — | Cu | 1.3 | | | | | Remainder |
| 22 | Pd, Au, Ag | AuAg alloy | Pd | 0.2 | 0.06 | — | Cu | 1.9 | | | | | Remainder |
| 23 | Pd | — | — | 0.3 | 0.16 | — | Cu | 2.2 | | | | | Remainder |
| 24 | Pd, Ag | PdAg alloy | Pd | 0.43 | 0.22 | — | Cu | 3.2 | | 0.025 | | | Remainder |
| 25 | Pt | — | — | 0.12 | 0.08 | — | Cu | 1.1 | | | | | Remainder |
| 26 | Single-layered copper wire (+Ag added) | | | | | Ag | Cu | 0.5 | | | | 0.020 | Remainder |
| 27 | Single-layered copper wire (+Pd added) | | | | | Pd | Cu | 0.2 | 0.010 | | | | Remainder |
| 28 | Single-layered copper wire (+Pd added) | | | | | Pd | Cu | 1.3 | | | 0.004 | | Remainder |
| Comparative examples 1 | Single-layered copper wire (Highly-pure Cu) | | | | | | Cu | 0 | | | | | Remainder |
| 2 | Pd, Ag | PdAg alloy | Pd | 0.03 | 0.001 | — | Cu | 0.3 | | | | | Remainder |
| 3 | Pd | — | — | 0.008 | 0.008 | — | Cu | 0.1 | | | | 0.012 | Remainder |
| 4 | Pd | — | — | 0.02 | 0.002 | — | Cu | 0.2 | | | | | Remainder |
| 5 | Ag | — | — | 0.06 | 0.005 | — | Cu | 0.4 | | | | | Remainder |
| 6 | Single-layered copper wire (+Pd added) | | | | | Pd | Cu | 0.1 | | | | | Remainder |

TABLE 3

| | | High-temperature reliability | | | | | | | High-humidity/temperature reliability | | | | | | |
|---|---|---|---|---|---|---|---|---|---|---|---|---|---|---|---|
| | | 150° C. | | | | 175° C. | 200° C. 1000 h | | HAST test | | | 408 h | UHAST test | | |
| | | 3000 h | 3500 h | 4000 h | 4500 h | 2000 h | Al: 1 μm thick | 2 μm thick | 192 h | 288 h | 336 h | 0.6 μm thick Al film: 1 μm thick | 300 h | 500 h | 700 h |
| Working examples 1 | | ◎ | ○ | ○ | △ | △ | △ | △ | ○ | ○ | △ | △ | △ | ○ | ○ | △ |
| 2 | | ◎ | ○ | ○ | △ | ○ | △ | △ | ○ | ○ | △ | △ | △ | ○ | ○ | △ |
| 3 | | ◎ | ○ | ○ | ○ | ◎ | ○ | ○ | ◎ | ○ | ○ | ○ | △ | ◎ | ○ | ○ |
| 4 | | ◎ | ◎ | ◎ | ○ | ◎ | ◎ | ○ | ◎ | ◎ | ◎ | ◎ | ○ | ◎ | ○ | ○ |
| 5 | | ◎ | ◎ | ◎ | ◎ | ◎ | ◎ | ○ | ◎ | ◎ | ◎ | ◎ | ◎ | ◎ | ◎ | ◎ |
| 6 | | ◎ | ◎ | ◎ | ◎ | ◎ | ◎ | ◎ | ◎ | ◎ | ◎ | ◎ | ◎ | ◎ | ◎ | ◎ |
| 7 | | ◎ | ◎ | ◎ | ◎ | ◎ | ◎ | ◎ | ◎ | ◎ | ◎ | ◎ | ◎ | ◎ | ◎ | ◎ |
| 8 | | ◎ | ◎ | ◎ | ◎ | ◎ | ◎ | ◎ | ◎ | ◎ | ◎ | ◎ | ◎ | ◎ | ◎ | ◎ |
| 9 | | ◎ | ◎ | ◎ | ◎ | ◎ | ◎ | ◎ | ◎ | ◎ | ◎ | ◎ | ◎ | ◎ | ◎ | ◎ |
| 10 | | ◎ | ◎ | ◎ | ◎ | ◎ | ◎ | ◎ | ◎ | ◎ | ◎ | ◎ | ○ | ◎ | ◎ | ◎ |
| 11 | | ◎ | ◎ | ◎ | ◎ | ◎ | ◎ | ◎ | ◎ | ◎ | ◎ | ◎ | ○ | ◎ | ◎ | ◎ |
| 12 | | ◎ | ◎ | ◎ | ◎ | ◎ | ○ | ○ | ◎ | ◎ | ◎ | ◎ | ◎ | ◎ | ◎ | ◎ |
| 13 | | ◎ | ○ | ○ | ○ | ○ | △ | △ | ○ | ○ | △ | △ | △ | ○ | ○ | △ |
| 14 | | ◎ | ◎ | ◎ | ○ | ○ | ○ | ○ | ◎ | ◎ | ○ | ○ | △ | ◎ | ○ | △ |
| 15 | | ◎ | ◎ | ◎ | ◎ | ◎ | ◎ | ◎ | ◎ | ◎ | ◎ | ◎ | ◎ | ◎ | ◎ | ○ |
| 16 | | ◎ | ◎ | ◎ | ◎ | ◎ | ◎ | ◎ | ◎ | ◎ | ◎ | ◎ | ○ | ◎ | ◎ | ◎ |
| 17 | | ◎ | ◎ | ◎ | ◎ | ◎ | ◎ | ◎ | ◎ | ◎ | ◎ | ◎ | ◎ | ◎ | ◎ | ◎ |
| 18 | | ◎ | ◎ | ◎ | ◎ | ◎ | ◎ | ◎ | ◎ | ◎ | ◎ | ◎ | ◎ | ◎ | ◎ | ◎ |
| 19 | | ◎ | ◎ | ◎ | ◎ | ◎ | ◎ | ◎ | ◎ | ◎ | ◎ | ◎ | ◎ | ◎ | ◎ | ◎ |
| 20 | | ◎ | ◎ | ◎ | ◎ | ◎ | ◎ | ◎ | ◎ | ◎ | ◎ | ◎ | ◎ | ◎ | ◎ | ◎ |
| 21 | | ◎ | ◎ | ◎ | ◎ | ◎ | ◎ | ◎ | ◎ | ◎ | ◎ | ◎ | ◎ | ◎ | ◎ | ◎ |
| 22 | | ◎ | ◎ | ◎ | ◎ | ◎ | ◎ | ◎ | ◎ | ◎ | ◎ | ◎ | ◎ | ◎ | ◎ | ◎ |
| 23 | | ◎ | ◎ | ◎ | ◎ | ◎ | ◎ | ◎ | ◎ | ◎ | ◎ | ◎ | ○ | ◎ | ◎ | ◎ |
| 24 | | ◎ | ◎ | ◎ | ◎ | ◎ | ◎ | ◎ | ◎ | ◎ | ◎ | ◎ | ◎ | ◎ | ◎ | ◎ |
| 25 | | ◎ | ○ | ○ | ○ | △ | △ | △ | ○ | ○ | △ | △ | △ | ○ | ○ | △ |
| 26 | | ◎ | ○ | △ | △ | ◎ | ◎ | ○ | ◎ | ○ | △ | △ | △ | ◎ | ○ | △ |
| 27 | | ◎ | ◎ | ◎ | ◎ | ◎ | ◎ | ○ | ◎ | ◎ | ◎ | ◎ | ○ | ◎ | ◎ | ○ |
| 28 | | ◎ | ◎ | ◎ | ◎ | ◎ | ◎ | ◎ | ◎ | ◎ | ◎ | ◎ | ◎ | ◎ | ◎ | ◎ |
| Comparative examples 1 | | X | X | X | X | X | X | X | X | X | X | X | X | X | X | X |
| 2 | | X | X | X | X | X | X | X | X | X | X | X | X | X | X | X |
| 3 | | X | X | X | X | X | X | X | X | X | X | X | X | X | X | X |
| 4 | | X | X | X | X | X | X | X | X | X | X | X | X | X | X | X |
| 5 | | X | X | X | X | X | X | X | X | X | X | X | X | X | X | X |
| 6 | | X | X | X | X | X | X | X | X | X | X | X | X | X | X | X |

TABLE 3-continued

|  |  | Ball-bonded shape | Shear strength | Chip damage | Metal lift | Loop control | Low loop | Leaning property | Wedge bonding |  |
|---|---|---|---|---|---|---|---|---|---|---|
| Working examples | 1 | ⊚ | ⊚ | ⊚ | ○ | Δ | Δ | Δ | ○ | 1 |
|  | 2 | ⊚ | ⊚ | ⊚ | ⊚ | ⊚ | ○ | Δ | ⊚ | 2 |
|  | 3 | ○ | ⊚ | ⊚ | ⊚ | ⊚ | ⊚ | Δ | ⊚ | 3 |
|  | 4 | ○ | ⊚ | ⊚ | ⊚ | ⊚ | ⊚ | Δ | ⊚ | 4 |
|  | 5 | ⊚ | ⊚ | ⊚ | ⊚ | ⊚ | ⊚ | Δ | ⊚ | 5 |
|  | 6 | ⊚ | ⊚ | ⊚ | ⊚ | ⊚ | Δ | ⊚ | ⊚ | 6 |
|  | 7 | ⊚ | ⊚ | ⊚ | ⊚ | ⊚ | Δ | Δ | ⊚ | 7 |
|  | 8 | ⊚ | ⊚ | ⊚ | ⊚ | ⊚ | ⊚ | ⊚ | ⊚ | 8 |
|  | 9 | ⊚ | ⊚ | ⊚ | ⊚ | ⊚ | Δ | ⊚ | ⊚ | 9 |
|  | 10 | ⊚ | ⊚ | ⊚ | ○ | ⊚ | Δ | Δ | ○ | 10 |
|  | 11 | ⊚ | ○ | Δ | ○ | Δ | Δ | Δ | ○ | 11 |
|  | 12 | ⊚ | ⊚ | ○ | ⊚ | ○ | ⊚ | ⊚ | ⊚ | 12 |
|  | 13 | ○ | ⊚ | ⊚ | ⊚ | ⊚ | Δ | Δ | ⊚ | 13 |
|  | 14 | ⊚ | ⊚ | ⊚ | ⊚ | ⊚ | Δ | Δ | ⊚ | 14 |
|  | 15 | ○ | ⊚ | ⊚ | ⊚ | ⊚ | ○ | Δ | ⊚ | 15 |
|  | 16 | ⊚ | ⊚ | ⊚ | ⊚ | ⊚ | ⊚ | Δ | ⊚ | 16 |
|  | 17 | ⊚ | ⊚ | ⊚ | ⊚ | ⊚ | ⊚ | Δ | ⊚ | 17 |
|  | 18 | ⊚ | ⊚ | ⊚ | ⊚ | ⊚ | Δ | Δ | ⊚ | 18 |
|  | 19 | ⊚ | ⊚ | ⊚ | ⊚ | ⊚ | Δ | ⊚ | ⊚ | 19 |
|  | 20 | ⊚ | ⊚ | ⊚ | ⊚ | ⊚ | ⊚ | Δ | ⊚ | 20 |
|  | 21 | ⊚ | ⊚ | ⊚ | ⊚ | ⊚ | Δ | ⊚ | ⊚ | 21 |
|  | 22 | ⊚ | ⊚ | ⊚ | ⊚ | ⊚ | Δ | ○ | ⊚ | 22 |
|  | 23 | ⊚ | ⊚ | ⊚ | ○ | ○ | Δ | Δ | ⊚ | 23 |
|  | 24 | ⊚ | Δ | ○ | ○ | Δ | ○ | ⊚ | Δ | 24 |
|  | 25 | Δ | ○ | ⊚ | ○ | ○ | Δ | Δ | Δ | 25 |
|  | 26 | Δ | ⊚ | ⊚ | ⊚ | ○ | ⊚ | Δ | Δ | 26 |
|  | 27 | Δ | ⊚ | ⊚ | ⊚ | ○ | ⊚ | Δ | Δ | 27 |
|  | 28 | Δ | ⊚ | ⊚ | ⊚ | ○ | ⊚ | Δ | Δ | 28 |
| Comparative examples | 1 | X | Δ | ⊚ | ○ | ○ | X | X | X | 1 |
|  | 2 | Δ | ⊚ | ⊚ | ⊚ | ○ | Δ | ⊚ | ⊚ | 2 |
|  | 3 | Δ | ⊚ | ⊚ | ⊚ | ⊚ | ⊚ | Δ | ○ | 3 |
|  | 4 | Δ | ⊚ | ⊚ | ⊚ | ⊚ | Δ | Δ | ⊚ | 4 |
|  | 5 | Δ | ⊚ | ⊚ | ⊚ | ⊚ | Δ | Δ | ⊚ | 5 |
|  | 6 | Δ | ⊚ | ⊚ | ⊚ | ○ | X | Δ | X | 6 |

The invention claimed is:

1. A bonding structure of a copper bonding wire connected to an electrode of a semiconductor device through a ball-bonded portion obtained by bonding to an aluminum electrode a ball portion formed on a front end of said copper bonding wire, wherein said ball-bonded portion exhibits, on a cross-sectional surface thereof, a relative compound ratio R1 of 50-100% after being heated at any temperature in a range of 130-200° C., said relative compound ratio R1 being a ratio of a thickness of an intermetallic compound of a CuAl phase to a total thickness of intermetallic compounds that are composed of Cu and Al and formed on a cross-sectional surface of said ball-bonded portion.

2. The bonding structure according to claim 1, wherein said ball-bonded portion exhibits, on the cross-sectional surface thereof, a relative compound ratio R2 of 50-100% after being heated at any temperature in the range of 130-200° C. and at any relative humidity in a range of 85-100%, said relative compound ratio R2 being a ratio of the thickness of said intermetallic compound of the CuAl phase to the total thickness of the intermetallic compounds that are composed of Cu and Al and formed on the cross-sectional surface of said ball-bonded portion.

3. The bonding structure according to claim 1, wherein a ratio of a total thickness of intermetallic compounds of $Cu_9Al_4$ and $CuAl_2$ phases to the total thickness of the intermetallic compounds that are composed of Cu and Al and formed in said ball-bonded portion, is not lower than 0% but lower than 40%.

4. The bonding structure according to claim 1, wherein said ball-bonded portion includes a concentrated layer of at least one of Pd, Au and Ag serving as electrically-conductive metals.

5. The bonding structure according to claim 4, wherein said ball-bonded portion further includes an intermetallic compound composed of: Cu; Al; and at least one of Pd, Au and Ag serving as the electrically-conductive metals.

6. The bonding structure according to claim 1, wherein said ball-bonded portion further includes a Cu alloy layer containing at least one of Pd, Au and Ag serving as electrically-conductive metals in a total concentration of up to 0.5-30 mol %.

7. A copper bonding wire for semiconductor device connected to an electrode of a semiconductor device through a ball-bonded portion obtained by bonding to an aluminum electrode a ball portion formed on a front end of said copper bonding wire, wherein said ball-bonded portion exhibits, on a cross-sectional surface thereof, a relative compound ratio R1 of 50-100% after being heated at any temperature in a range of 130-200° C., said relative compound ratio R1 being a ratio of a thickness of an intermetallic compound of a CuAl phase to a total thickness of intermetallic compounds that are composed of Cu and Al and formed on a cross-sectional surface of said ball-bonded portion.

8. The copper bonding wire for semiconductor device according to claim 7, comprising:
a core member mainly composed of copper; and
an outer layer mainly composed of at least one of Pd, Au and Ag serving as electrically-conductive metals.

9. The copper bonding wire for semiconductor device according to claim 8, wherein said outer layer includes:
a single metal outer layer composed of one of Pd, Au and Ag serving as the electrically-conductive metals; and
an alloy outer layer mainly composed of at least two of Pd, Au and Ag serving as the electrically-conductive metals.

10. The copper bonding wire for semiconductor device according to claim 9, wherein said outer layer is formed to a thickness of 0.01-0.4 μm.

11. The copper bonding wire for semiconductor device according to claim 7, containing at least one of Pd, Au and Ag serving as the electrically-conductive metals in a range of 0.1-3 mol %.

12. The copper bonding wire for semiconductor device according to claim 8, containing at least one of P, Si, B and Ge, in a range of 0.0001-0.03 mol %.

13. The bonding structure according to claim 2, wherein a ratio of a total thickness of intermetallic compounds of $Cu_9Al_4$ and $CuAl_2$ phases to the total thickness of the intermetallic compounds that are composed of Cu and Al and formed in said ball-bonded portion, is not lower than 0% but lower than 40%.

14. The copper bonding wire for semiconductor device according to claim 8, containing at least one of Pd, Au and Ag serving as the electrically-conductive metals in a range of 0.1-3 mol %.

* * * * *